United States Patent
Jing et al.

(10) Patent No.: US 12,272,411 B2
(45) Date of Patent: Apr. 8, 2025

(54) MEMORY AND ITS ERASE VERIFICATION METHOD, OPERATION METHOD, AND A MEMORY SYSTEM

(71) Applicant: YANGTZE MEMORY TECHNOLOGIES CO., LTD., Wuhan (CN)

(72) Inventors: Chong Jing, Wuhan (CN); Hong Cao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 160 days.

(21) Appl. No.: 18/092,082

(22) Filed: Dec. 30, 2022

(65) Prior Publication Data

US 2024/0013842 A1 Jan. 11, 2024

Related U.S. Application Data

(63) Continuation of application No. PCT/CN2022/094436, filed on May 23, 2022.

(30) Foreign Application Priority Data

May 25, 2021 (CN) .......................... 202110573212.9

(51) Int. Cl.
*G11C 16/08* (2006.01)
*G11C 16/04* (2006.01)
(Continued)

(52) U.S. Cl.
CPC ...... *G11C 16/3445* (2013.01); *G11C 16/0483* (2013.01); *G11C 16/08* (2013.01); *G11C 29/50004* (2013.01)

(58) Field of Classification Search
CPC . G11C 16/3445; G11C 16/0483; G11C 16/08; G11C 29/50004; G11C 2029/5004;
(Continued)

(56) References Cited

U.S. PATENT DOCUMENTS

2015/0117114 A1 4/2015 Wan et al.
2015/0179235 A1* 6/2015 Nam ...................... G11C 16/16
  365/218

(Continued)

FOREIGN PATENT DOCUMENTS

| CN | 105513639 A | 4/2016 |
| CN | 107045888 A | 8/2017 |
| CN | 113223596 A | 8/2021 |

OTHER PUBLICATIONS

International Search Report issued in corresponding International Application No. PCT/CN2022/094436, mailed on Aug. 10, 2022, 5 pages.

*Primary Examiner* — Xiaochun L Chen
(74) *Attorney, Agent, or Firm* — BAYES PLLC

(57) ABSTRACT

A method of erase verification of a memory includes performing a first erase verification operation on a memory block of the memory after performing an erase operation on the memory block. The method also includes determining a first verification result of the first erase verification operation. The method further includes determining whether to perform a second erase verification operation on the memory block based on the first verification result. The second erase verification operation is configured to determine whether there is inter-word line leakage in the memory block.

20 Claims, 13 Drawing Sheets

(51) Int. Cl.
*G11C 16/34* (2006.01)
*G11C 29/50* (2006.01)

(58) Field of Classification Search
CPC ........ G11C 2029/5006; G11C 11/5635; G11C 16/16; G11C 29/50; G11C 29/44
See application file for complete search history.

(56) References Cited

U.S. PATENT DOCUMENTS

2016/0125956 A1* 5/2016 Magia .................... G11C 29/52
 714/719
2022/0139457 A1* 5/2022 Kim ....................... G11C 16/16
 365/185.13

* cited by examiner

MEMORY AND ITS ERASE VERIFICATION METHOD, OPERATION METHOD, AND A MEMORY SYSTEM

CROSS-REFERENCE TO RELATED APPLICATIONS

The present disclosure is a continuation of International Application No. PCT/CN2022/094436, filed on May 23, 2022, which claims the benefit of priority to Chinese Application No. 202110573212.9 filed on May 25, 2021, both of which are incorporated herein by reference in their entireties.

TECHNICAL FIELD

The present disclosure relates to the semiconductor field, in particular to a memory and an erase verification method thereof, an operation method, and a memory system.

BACKGROUND

Recently, semiconductor memories with memory cells stacked vertically (i.e., three-dimensional (3D)) are widely used in electronic devices, which typically include multiple layers vertically stacked (e.g., the top layer and the bottom layer formed by dual stacking process in 3D nonvolatile). There are multiple vertically stacked memory cells in each layer in 3D nonvolatile memory, so that each layer can be read, programmed, and erased independently.

When the data system operates the 3D nonvolatile memory, it usually determines whether the erase operation or the programming operation succeeds or fails according to the status fed back by the 3D nonvolatile memory. Generally, when the data system receives the status fed back by the 3D nonvolatile memory about the success of the programming operation, the data stored in the buffer of the data system will be released. However, there are some inherent defects in the 3D nonvolatile memory, which do not affect the success of the erase operation or programming operation, but may cause the written data to be abnormal, resulting in uncorrectable error correction code (UECC) in subsequent read operations, causing data loss. This is particularly the case in multi-plane programming, in which data loss on one plane will also cause data loss on adjacent planes; this situation is called neighbor plane disturb (NPD).

SUMMARY

In order to solve one or more technical problems in the art, a memory and an erase verification method thereof, an operation method, a memory system are provided by the implementations of this disclosure. By performing two kinds of verification operations on the memory to determine whether the memory block is a bad block to determine whether to perform a programming operation on the memory block, the data loss situation can be reduced, and the NPD phenomenon will not be caused in multi-plane programming.

An implementation of the present disclosure provides an erase verification method of a memory comprising: performing a first erase verification operation on a selected memory block of the memory after performing an erase operation on the memory block; determining a first verification result of the first erase verification operation; the first verification result being configured to reflect whether the memory block was successfully erased after the erase operation; and determining whether to perform a second erase verification operation on the memory block based on the first verification result; the second erase verification operation being configured to determine whether there is inter-word line leakage in the memory block.

In above scheme, determining whether to perform the second erase verification operation on the memory block based on the first verification result comprises: determining to perform the second erase verification operation on the memory block when the first verification result is configured to indicate that the memory block was successfully erased after the erase operation; and determining not to perform the second erase verification operation on the memory block when the first verification result is configured to indicate that the memory block was not successfully erased after the erase operation.

In above scheme, the erase verification method further comprises: performing the second erase verification operation on the memory block when it is determined to perform the second erase verification operation on the memory block; and determining a second verification result of the second erase verification operation, wherein the second verification result is configured to reflect whether there is inter-word line leakage in the memory block.

In above scheme, the erase verification method further comprises: saving a first flag when the first verification result is configured to indicate that the memory block was not successfully erased after the erase operation or when the second verification result indicates that there is inter-word line leakage in the memory block, wherein the first flag is configured to indicate that the memory block is a bad block.

In above scheme, the erase verification method further comprises: saving a second flag when the second verification result indicates that there is no inter-word line leakage in the memory block, wherein the second flag is configured to indicate that the memory block is an available block.

In above scheme, the first erase verification operation comprises: applying an erase verification voltage to the memory block to sense a signal to be verified corresponding to the erase verification voltage; and determining the first verification result of the first erase verification operation based on the signal to be verified.

In above scheme, the memory comprises memory blocks; each of the memory blocks comprising memory cells and word lines coupled to the plurality of memory cells, respectively; and applying the erase verification voltage to the memory block comprises applying the erase verification voltage to the plurality of word lines in the memory block using a same voltage source or a different voltage source.

In above scheme, the second erase verification operation comprises: applying a leakage detection voltage to a word line to be detected in the memory block to detect a residual voltage of the word line to be detected after a preset time; comparing the residual voltage and the reference voltage to obtain a comparison result; determining the second verification result based on the comparison result.

In above scheme, applying the leakage detection voltage to the word line to be detected in the memory block to detect the residual voltage of the word line to be detected after the preset time comprises: applying the leakage detection voltage to the word line to be detected; grounding a word line adjacent to the word line to be detected; stopping applying the leakage detection voltage to the word line to be detected when the leakage detection voltage of the word line to be detected reaches a predetermined value; and detecting the residual voltage of the word line to be detected after the preset time.

In above scheme, determining the second verification result based on the comparison result comprises: determining that the second verification result is configured to indicate that there is no leakage between the word line to be detected and the adjacent word line in the memory block when the comparison result is that an absolute value of a difference between the residual voltage and the reference voltage is less than a preset threshold; and determining that the second verification result is configured to indicate that there is leakage between the word line to be detected and the adjacent word line in the memory block when the comparison result is that the absolute value of the difference between the residual voltage and the reference voltage is not less than the preset threshold.

In above scheme, the second erase verification operation is performed by an inter-word line leakage detection circuit built in the memory.

In above scheme, the erase verification method further comprises: determining to perform the second erase verification operation on word lines of a predetermined range in the memory block when the first verification result is configured to indicate that the memory block was successfully erased after the erase operation.

In above scheme, the first flag or the second flag is stored in a register in the memory.

The implementation of the present disclosure provides an operation method comprises: performing an erase operation on a selected memory block in the memory; and performing the erase verification method of any one of the foregoing on the memory to determine whether there is inter-word line leakage in the memory block.

In above scheme, the operation method further comprises: in response to the first verification result as a feedback being configured to indicate that the memory block is not successfully erased after the erase operation, determining whether the erase operation currently performed has reached a maximum number of erases; in response to it is determined that the erase operation currently performed has not reached the maximum number of erases, continuing to perform the erase operation and a first erase verification operation until the maximum number of erases is reached; and in response to it is determined that the erase operation currently performed has reached the maximum number of erases, determining to mark the memory block as a bad block.

The implementation of present disclosure provides a memory, comprises: a memory array; the memory array comprising a plurality of memory blocks; and a peripheral circuit coupled to the memory array; wherein, the peripheral circuit is configured to perform a first erase verification operation on a selected memory block of the memory after performing an erase operation on the memory block; determine a first verification result of the first erase verification operation; determining whether to perform a second erase verification operation on the memory block based on the first verification result; the first verification result being configured to reflect whether the memory block was successfully erased after the erase operation; and the second erase verification operation being configured to determine whether there is inter-word line leakage in the memory block.

In above scheme, the peripheral circuit comprises: a control circuit, a voltage generator, a word line driver, and a sense amplifier; the voltage generator, the word line driver, and the sense amplifier being coupled to the plurality of memory blocks and being controlled by the control circuit; the word line driver being configured to apply an erase verification voltage to the memory block through the voltage generator under the control of the control circuit; the sense amplifier being configured to sense a signal to be verified corresponding to the erase verification voltage; and the control circuit being configured to determine the first verification result of the first erase verification operation based on the signal to be verified; determine whether to perform the second erase verification operation on the memory block based on the first verification result.

In above scheme, the control circuit is further configured to: determine to perform the second erase verification operation on the memory block when the first verification result is configured to indicate that the memory block was successfully erased after the erase operation; and determine not to perform the second erase verification operation on the memory block when the first verification result is configured to indicate that the memory block was not successfully erased after the erase operation.

In above scheme, the control circuit is further configured to: perform the second erase verification operation on the memory block when it is determined to perform the second erase verification operation on the memory block; determine a second verification result of the second erase verification operation; and the second verification result being configured to reflect whether there is inter-word line leakage in the memory block.

In above scheme, the peripheral circuit further comprises: a first register configured to save a first flag when the first verification result is configured to indicate that the memory block was not successfully erased after the erase operation or when the second verification result indicates that there is inter-word line leakage in the memory block; and the first flag being configured to indicate that the memory block is a bad block.

In above scheme, the peripheral circuit further comprises: a second register configured to save a second flag when the second verification result is configured to indicate that there is no inter-word line leakage in the memory block; and the second flag being configured to indicate that the memory block is an available block.

In above scheme, the peripheral circuit further comprises: an inter-word line leakage detection circuit coupled to the memory block; the word line driver being further configured to apply a leakage detection voltage to a word line to be detected in the memory block through the voltage generator under the control of the control circuit; ground a word line adjacent to the word line to be detected; and stop applying the leakage detection voltage to the word line to be detected when the leakage detection voltage of the word line to be detected reaches a predetermined value; the inter-word line leakage detection circuit being configured to detect a residual voltage of the word line to be detected after a preset time; compare the residual voltage with a reference voltage to obtain a comparison result; and transmit the comparison result to the control circuit; and the control circuit being further configured to receive the comparison result and feed the second verification result back to the control circuit based on the comparison result.

In above scheme, the control circuit is further configured to: determine that the second verification result is configured to indicate that there is no leakage between the word line to be detected and the adjacent word line in the memory block when the comparison result is that an absolute value of difference between the residual voltage and the reference voltage is less than a preset threshold; and determine that the second verification result is configured to indicate there is leakage between the word line to be detected and the adjacent word line in the memory block when the comparison result is that the absolute value of the difference between the residual voltage and the reference voltage is not less than the preset threshold.

In above scheme, the peripheral circuit further comprises: a first register configured to save a first flag when the first verification result is configured to indicate that the memory block was not successfully erased after the erase operation or when the second verification result indicates that there is inter-word line leakage in the memory block; and the first flag being configured to indicate that the memory block is a bad block.

In above scheme, the peripheral circuit further comprises: a second register configured to save a second flag when the second verification result indicates that there is no inter-word line leakage in the memory block; and the second flag being configured to indicate that the memory block is an available block.

In above scheme, the peripheral circuit further comprises: an inter-word line leakage detection circuit coupled to the memory block; the word line driver being further configured to apply a leakage detection voltage to a word line to be detected in the memory block through the voltage generator under the control of the control circuit; ground a word line adjacent to the word line to be detected; and stop applying the leakage detection voltage to the word line to be detected when the leakage detection voltage of the word line to be detected reaches a predetermined value; the inter-word line leakage detection circuit being configured to detect a residual voltage of the word line to be detected after a preset time; compare the residual voltage with a reference voltage to obtain a comparison result; and transmit the comparison result to the control circuit; and the control circuit being further configured to receive the comparison result and feed the second verification result back to the control circuit based on the comparison result.

In above scheme, the control circuit is further configured to: determine that the second verification result is configured to indicate that there is no leakage between the word line to be detected and the adjacent word line in the memory block when the comparison result is that an absolute value of a difference between the residual voltage and the reference voltage is less than a preset threshold; and determine that the second verification result is configured to indicate there is leakage between the word line to be detected and the adjacent word line in the memory block when the comparison result is that the absolute value of the difference between the residual voltage and the reference voltage is not less than the preset threshold.

In above scheme, the inter-word line leakage detection circuit comprises: a comparison module; wherein, the comparison module being configured to detect the residual voltage of the word line to be detected after the preset time; compare the residual voltage and the reference voltage to obtain the comparison result; and transmit the comparison result to the control circuit.

In above scheme, the inter-word line leakage detection circuit further comprises an isolation module, wherein the isolation module being configured to isolate the comparison module and the voltage generator.

In above scheme, the comparison module comprises a reference voltage source and a comparator, wherein the reference voltage source being configured to provide the reference voltage and input the reference voltage to the comparator; and the comparator being configured to detect the residual voltage of the word line to be detected after the preset time and receive the reference voltage; compare the residual voltage and the reference voltage to obtain a comparison result; and transmit the comparison result to the control circuit.

In above scheme, the isolation module comprises an isolation capacitor configured to isolate the comparison module and the voltage generator.

In above scheme, the peripheral circuit is further configured to determine to perform the second erase verification operation on word lines of a predetermined range in the memory block when the first verification result indicates that the memory block was not successfully erased after the erase operation.

In above scheme, the memory includes 3D NAND type memory.

The implementation of the present disclosure provides a memory system including: one or more memories in any one of the above implementations; and a memory controller coupled to the memories.

In above scheme, the peripheral circuit is configured to: receive a first instruction; in respond to the first instruction, perform an erase operation on a selected memory block in the memory, and perform a first erase verification operation on the memory block; feed a first verification result of the first erase verification operation back; determine whether to perform a second erase verification operation on the memory block based on the first verification result; the second erase verification operation being configured to determine whether there is inter-word line leakage in the memory block; save a first flag when the first verification result is configured to indicate that the memory block was not successfully erased after the erase operation or that there is inter-word line leakage in the memory block; save a second flag when the first verification result is configured to indicate that the memory block was successfully erased after the erase operation and that there is no word line leakage in the memory block;

the memory controller being configured to issue a second instruction according to the first flag; and issue a third instruction according to the second flag; and the peripheral circuit being configured to receive the second instruction; perform no programming operation on the memory block anymore in response to the second instruction; receive the third instruction; and perform the programming operation on the memory block in response to the third instruction.

The implementations of the present disclosure provide a memory and erasure verification method thereof, an operation method, and a memory system. The erase verification method of the memory includes: performing a first erase verification operation on a selected memory block of the memory after performing an erase operation on the memory block; determining a first verification result of the first erase verification operation; the first verification result being configured to reflect whether the memory block was successfully erased after the erase operation; and determining whether to perform a second erase verification operation on the memory block based on the first verification result; the second erase verification operation being configured to determine whether there is inter-word line leakage in the memory block. The erase verification method provided by the implementation of the present disclosure determines whether the selected memory block on which the erase operation has been performed passes by determining a first verification result of the first erase verification operation. A determination is then made as to whether to perform a second erase verification operation on the memory block based on the first verification result, to detect whether there is inter-word line leakage in the memory block (it is found that inter-word line leakage is the main factor leading to data discarding). With the erase verification operation of the present disclosure, whether the memory block is a bad block can be effectively detected, thereby effectively avoiding data loss caused by exceptions in subsequent programming operations. Thus, in multi-plane programming, the programming anomaly may be limited in the memory plane where the anomaly exists, and the influence of the programming anomaly on other normal memory planes can be reduced. That is, the adverse influence caused by adjacent interference can be reduced, i.e., the probability of NPD phenomenon can be reduced.

BRIEF DESCRIPTION OF THE DRAWINGS

Implementations of the present disclosure are illustrated in the drawings by way of example but not by limitation, in which like reference numerals designate like elements.

DETAILED DESCRIPTION

Figure 1:
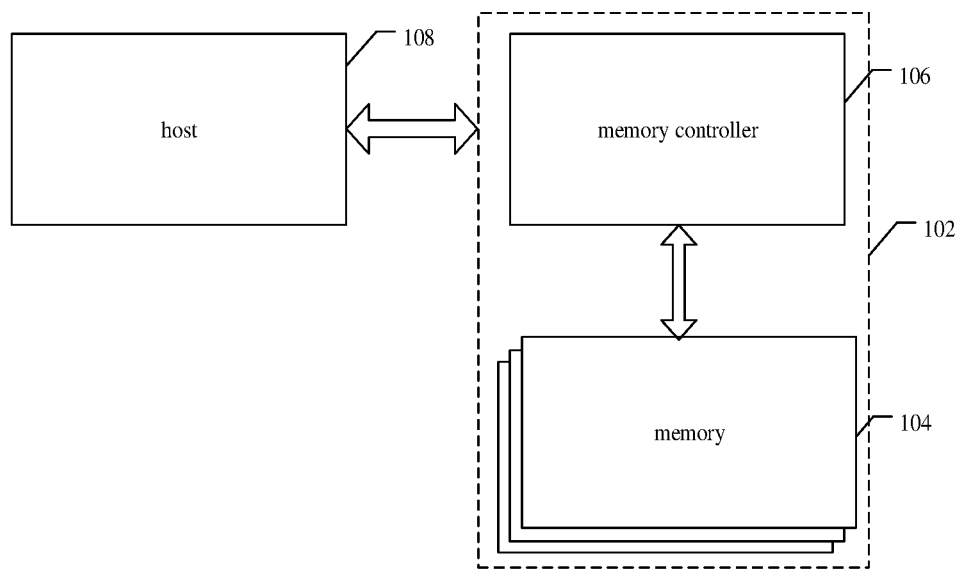
FIG. 1 is a block diagram of an exemplary system with memory provided according to implementations of the present disclosure.

In order to make the above objects, features, and advantages of the present disclosure more readily understood, particular implementations of the present disclosure are described in detail below when taken in conjunction with the accompanying drawings.

Many specific details are set forth in the following description to facilitate a full understanding of the disclosure, but the disclosure may also be practiced in other manners different from those described herein, and therefore the disclosure is not limited by the specific implementations disclosed below.

As shown in the present disclosure and the claims, the terms "a," "an," and/or "the" may not be specifically singular but include the plural, unless the context expressly suggests otherwise. In general, the terms "include" and "comprise" only indicate that clearly identified steps and elements that do not constitute an exclusive listing are included. The method or device may also include other steps or elements.

In detailed implementations of the present disclosure, the cross-sectional views illustrating the structure of the device may be enlarged locally, not to a general scale, for ease of illustration. The schematic views are illustrative only and should not herein limit the scope of protection of the present disclosure. In addition, the 3D space dimensions of length, width, and depth should be included in the actual production.

Spatial relationship terms such as "beneath," "below," "under," "lower," "above," "over" and the like may be used herein for convenience of description to describe the relationship of one element or feature shown in the drawings with other elements or features. It will be understood that these spatially related terms are intended to encompass directions of the device in use or operation other than those depicted in the drawings. For example, if the devices in the drawings are flipped, the orientation of elements described as "below" or "under" or "beneath" other elements or features will be changed to "above" the other elements or features. Thus the exemplary words "below" and "under" can encompass both above and below directions The device may also have other orientations (rotated 90 degrees or in other directions), so that the spatial relationship descriptors used here should be interpreted accordingly. It will also be understood that when a layer is referred to as "between" two layers, it may be the only layer between the two layers or there may also be one or more layers there between.

In the context of the present disclosure, the structures described in which the first feature is "on" the second feature may include implementations in which the first and second features are formed in direct contact or may include implementations in which additional features are formed between the first and second features, such that the first and second features may not be in direct contact.

In addition, it should be noted that the terms "first" and "second" are used to define parts only for the purpose of distinguishing the corresponding parts. Unless otherwise stated, the above terms have no special meaning and, therefore cannot be understood as limiting the scope of protection of this disclosure.

The term "three dimensional (3D) memory device" as used herein refers to a semiconductor device having a vertically oriented memory cell transistors strings (referred to herein as "memory cell strings" such as NAND strings) on a laterally oriented substrate such that the memory cell strings extend in a vertical direction relative to the substrate. The term "vertically/upright" as used herein means a transverse surface nominally perpendicular to the substrate.

As used herein, belonging to a "substrate" refers to a material to which a subsequent layer of material is added.

The substrate itself may be patterned. The material added to the top of the substrate may be patterned or may remain un-patterned. In addition, the substrate may include a variety of semiconductor materials such as silicon, germanium, gallium arsenide, indium phosphide, and the like. Alternatively, the substrate may be made of a non-conductive material, such as a glass, plastic, or sapphire wafer.

As used in this disclosure, the term "layer" refers to a portion of material that includes a region having a thickness. The layer may extend over the entire lower or upper structure or may have a range smaller than the lower or upper structure range. In addition, the layer may be a region of a uniform or non-uniform continuous structure whose thickness is less than the thickness of the continuous structure. For example, a layer can be located between any set of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductive and contact layers (in which contacts, interconnect lines, and/or vias are formed) and one or more dielectric layers.

Flow charts are used in the present disclosure to illustrate operations performed by the system according to implementations of the present disclosure. It should be understood that the preceding or following operations are not necessarily performed precisely in order. Instead, various steps can be processed in reverse order or at the same time. At the same time, other actions may be added to these processes.

FIG. 1 illustrates a block diagram of an exemplary system 100 having a memory device, according to some aspects of the present disclosure. System 100 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 1, system 100 can include a host 108 and a memory system 102 having one or more memory devices 104 and a memory controller 106. Host 108 can be a processor of an electronic device, such as a central processing unit (CPU), or a system-on-chip (SoC), such as an application processor (AP). Host 108 can be configured to send or receive the data to or from memory devices 104.

In particular, the memory device 104 may be any of the memory devices disclosed in the present disclosure, such as a NAND flash memory device (such as a three-dimensional (3D) NAND flash memory device), as disclosed in detail below.

According to some implementations, memory controller 106 is coupled to memory device 104 and host 108, and is configured to control the memory device 104. The memory controller 106 may manage data stored in the memory device 104 and communicate with the host 108. In some implementations, memory controller 106 is designed for operating in a low duty-cycle environment like secure digital (SD) cards, compact Flash (CF) cards, universal serial bus (USB) Flash drives, or other media for use in electronic devices of low duty-cycle environment, such as personal computers, digital cameras, mobile phones, etc. In some implementations, memory controller 106 is designed for operating in a high duty-cycle environment like SSDs or embedded multi-media-cards (eMMCs) used as data storage for mobile devices of high duty-cycle environment, such as smartphones, tablets, laptop computers, etc., and enterprise storage arrays. Memory controller 106 can be configured to control operations of memory device 104, such as read, erase, and program operations. Memory controller 106 can also be configured to manage various functions with respect to the data stored or to be stored in memory device 104 including, but not limited to bad-block management, garbage collection, logical-to-physical address conversion, wear leveling, etc. In some implementations, memory controller 106 is further configured to process error correction codes (ECCs) with respect to the data read from or written to memory device 104. Any other suitable functions may be performed by memory controller 106 as well, for example, formatting memory device 104. Memory controller 106 can communicate with an external device (e.g., host 108) according to a particular communication protocol. For example, memory controller 106 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 2A:
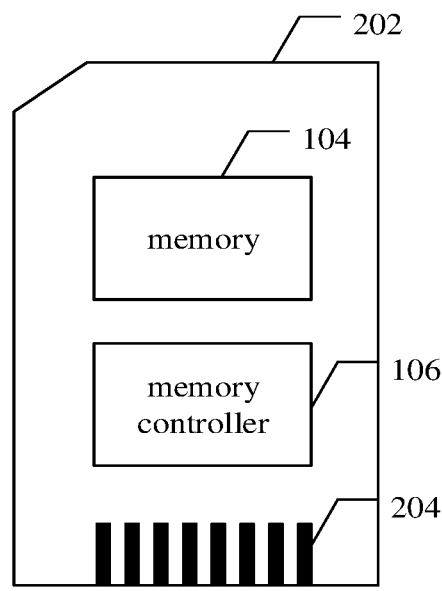
FIG. 2A is a schematic diagram of an exemplary memory card with memory provided according to an implementation of the present disclosure.
Figure 2B:
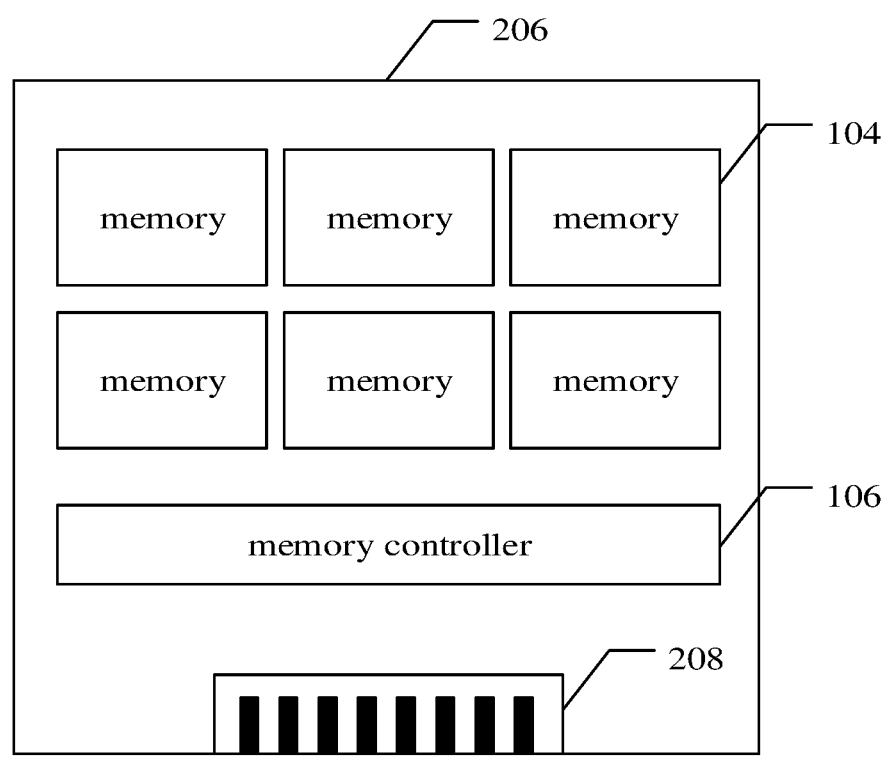
FIG. 2B is a schematic diagram of an exemplary solid-state drive (SSD) with memory provided according to an implementation of the present disclosure.

Memory controller 106 and one or more memory devices 104 can be integrated into various types of storage devices, for example, be included in the same package, such as a universal Flash storage (UFS) package or an eMMC package. That is, memory system 102 can be implemented and packaged into different types of end electronic products. In one example as shown in FIG. 2A, memory controller 106 and a single memory device 104 may be integrated into a memory card 202. Memory card 202 can include a PC card (PCMCIA, personal computer memory card international association), a CF card, a smart media (SM) card, a memory stick, a multimedia card (MMC, RS-MMC, MMCmicro), an SD card (SD, miniSD, microSD, SDHC), a UFS, etc. Memory card 202 can further include a memory card connector 204 coupling memory card 202 with a host (e.g., host 108 in FIG. 1). In another example as shown in FIG. 2B, memory controller 106, and multiple memory devices 104 may be integrated into an SSD 206. SSD 206 can further include an SSD connector 208 coupling SSD 206 with a host (e.g., host 108 in FIG. 1). In some implementations, the storage capacity and/or the operation speed of SSD 206 is greater than those of memory card 202.

Figure 3:
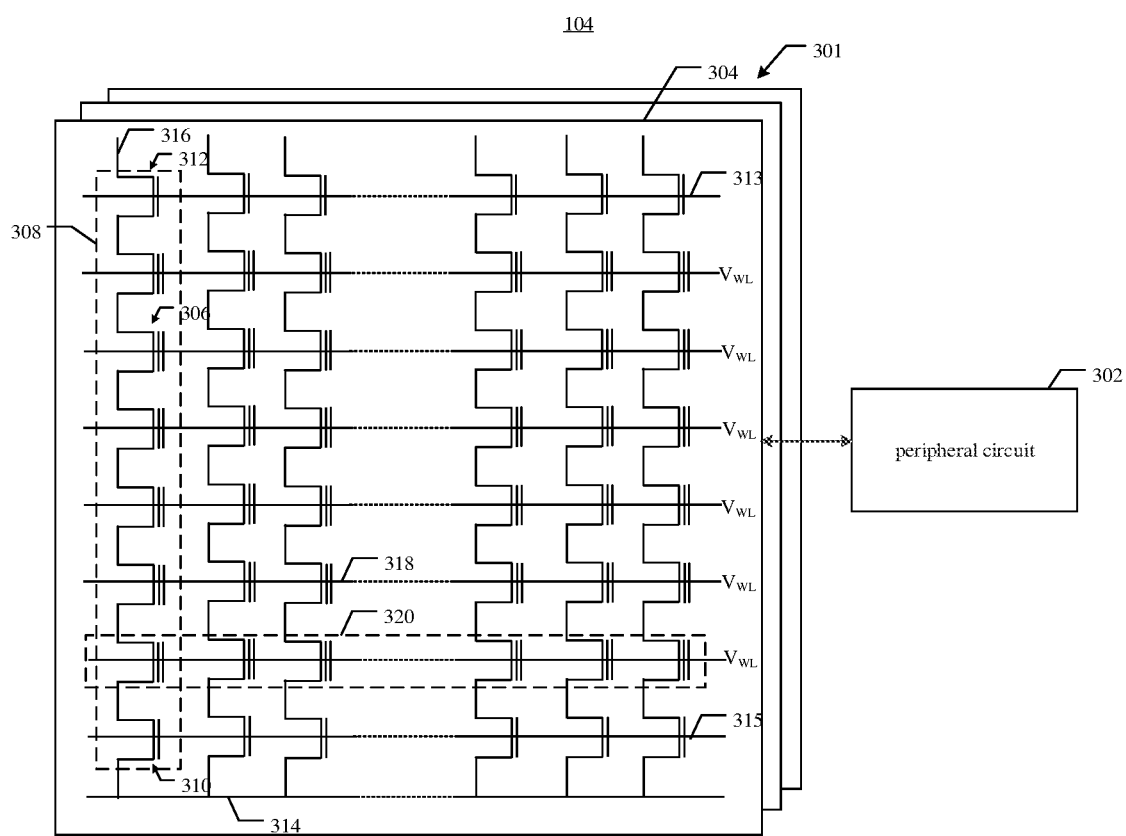
FIG. 3 is a schematic diagram of an exemplary memory including a peripheral circuit provided according to implementations of the present disclosure.

FIG. 3 illustrates a schematic circuit diagram of an exemplary memory device 104 including a peripheral circuit according to some aspects of the present disclosure. As shown in FIG. 3, the memory device 104 may include a memory array 301 and a peripheral circuit 302 coupled to the memory array 301. The memory array 301 may be a NAND flash memory array in which the memory transistors 306 are provided in the form of an array of NAND memory cell strings 308, each extending vertically over a substrate (not shown). In some implementations, each NAND memory cell string 308 includes a plurality of memory transistors 306 coupled in series and stacked vertically. Each memory transistor 306 may maintain a continuous analog value, such as voltage or charge, which depends on the number of electrons trapped within the region of the memory transistor 306. Each memory transistor 306 may be a floating gate type memory transistor including a floating gate transistor or a charge trap type memory transistor including a charge trap transistor.

Each of the memory transistors 306 discussed above (i.e., memory cells described later) may be a single-level memory cell or a multi-level memory cell. The single-level memory cell may be a single-level cell (SLC) capable of storing one bit (bit); the multi-level memory cell may be a multi-level unit (MLC) capable of storing 2 bits, a third-level unit (TLC) capable of storing 3 bits, a fourth-level unit (QLC) capable of storing 4 bits, a fifth-level unit (PLC) capable of storing 5 bits, and so on.

Referring back to FIG. 3, each NAND memory string 308 includes a source select gate (SSG) transistor 310 at its source end and a drain select gate (DSG) transistor 312 at its drain end. For example, the SSG transistor 310 and the DSG transistor 312 can be configured to activate the selected NAND memory strings 308 (columns of the array) during read and program operations. In some implementations, the sources of NAND memory strings 308 in the same block 304 are coupled with each other through a same source line (SL) 314, e.g., a common SL. In other words, all NAND memory strings 308 in the same block 304 have an array common source (ACS), according to some implementations. The DSG transistor 312 of each NAND memory cell string 308 is coupled to a respective bit line 316 from which data can be read or written via an output bus (not shown), according to some implementations. In some implementations, each NAND memory cell string 308 is configured to be selected or deselected by applying a select voltage (e.g., above the threshold voltage of the transistor having the DSG transistor 312) or a deselect voltage (e.g. 0V) to the corresponding DSG transistor 312 via one or more DSG lines 313 and/or by applying a select voltage (e.g. above the threshold voltage of the transistor having the SSG transistor 310) or a deselect voltage (e.g. 0V) to the corresponding SSG transistor 310 via one or more SSG lines 315.

Again, as shown in FIG. 3, the NAND memory cell string 308 may be organized as a plurality of memory blocks 304, each of which may have a common source line 314 (e.g., coupled to ground). In some implementations, each memory block 304 is a basic data unit for an erase operation, i.e., all memory transistors 306 on the same memory block 304 are erased simultaneously. It should be understood that, in some examples, the erase operation may be performed at the half-block level, at the quarter-block level or at a level having any suitable number of blocks or any suitable fraction of blocks. Memory transistors 306 of adjacent NAND memory cell strings 308 may be coupled through word lines 318 to select which row of memory transistors 306 is affected by read and program operations. In some implementations, each word line 318 is coupled to the page 320 of the memory transistor 306, which is a basic data unit for program operations. The size of a page 320 in bits may be related to the number of NAND memory cell strings 308 coupled by word lines 318 in a memory block 304. Each word line 318 may include a plurality of control gates (gate electrodes) at each memory transistor 306 in a respective page 320 and gate lines coupled to the control gates. In some implementations, a memory block 304 may also be divided into a plurality of memory sub-blocks, each of which is referred to as a string. Then erasing a memory block means erasing all strings contained in the memory block.

Figure 4A:
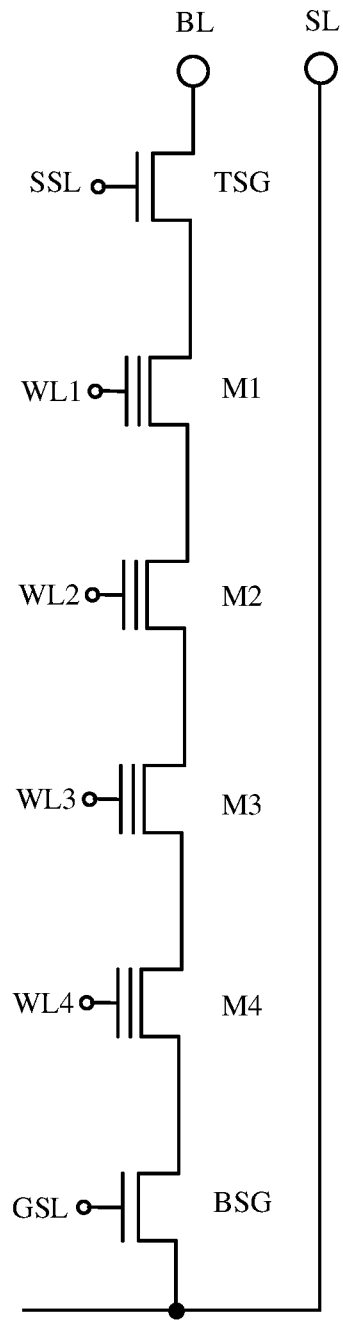
FIG. 4A is an exemplary circuit diagram of a memory cell string provided according to an implementation of the present disclosure.
Figure 4B:
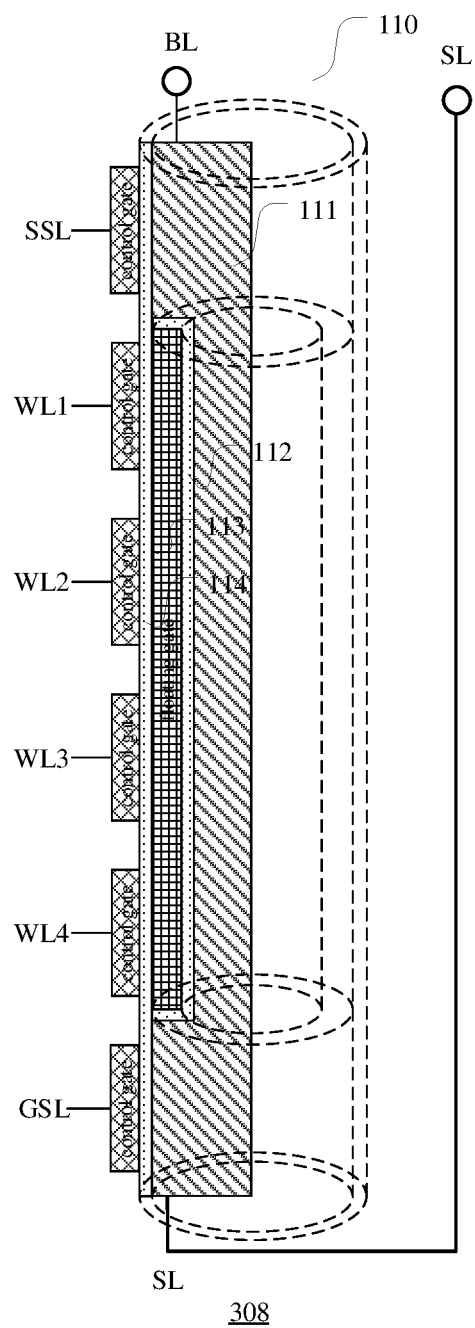
FIG. 4B is an exemplary structural diagram of a memory cell string provided according to an implementation of the present disclosure.

FIG. 4A and FIG. 4B show an exemplary circuit diagram and an exemplary schematic diagram of the structure of the memory cell string 308, respectively. The memory cell string shown in this implementation includes four memory transistors. It will be understood that the present disclosure is not limited to this. The number of memory transistors in memory cell string may be any number, such as 32 or 64.

As shown in FIG. 4A, the first end of the memory cell string 308 is connected to the bit line BL, and the second end is connected to the source line SL. The memory cell string 308 includes a plurality of transistors connected in series between a first terminal and a second terminal, including a top selection transistor TSG, memory transistors M1 to M4, and a bottom selection transistor BSG. The top selection transistor TSG is connected to the string selection line SSL through a drain selection gate (DSG) contained therein, and the bottom selection transistor BSG is connected to the ground selection line GSL through a source selection gate (SSG) contained therein. The gate conductors of the memory transistors M1 to M4 are connected to respective word lines 318 of the word lines WL1 to WL4, respectively. In some implementations, the drain selection gate (DSG) may also be referred to as a first control gate; the source selection gate (SSG) may also be referred to as a second control gate.

The memory cell string 308 structure as shown in FIG. 4B includes channel posts 110. A channel region 111 is included in an intermediate portion of the channel post 110. A tunneling dielectric layer 112, a charge storage layer 113, and a block dielectric layer 114 are provided in the channel region 111 to form the memory transistors M1 to M4. In this implementation, the channel region 111 is composed of, for example, doped polysilicon. The tunneling dielectric layer 112, the charge storage layer 113, and the block dielectric layer 114 may be composed of nitrides, respectively, for example, silicon nitride, silicon oxynitride, silicon or any combination thereof. The channel region 111 provides channel regions of a selection transistor and a memory transistor. The doping type of the channel region 111 is the same as that of the selection transistor and the memory transistor. For example, for the N-type selection transistor and the memory transistor, the channel region 111 may be N-type doped polysilicon.

In this implementation, the core of the channel post 110 is a channel region 111. A tunneling dielectric layer 112, a charge storage layer 113, and a block dielectric layer 114 form a stack structure fixed around the sidewall of the core. In an alternative implementation, the core of the channel post 110 is an additional insulating layer. The channel region 111, the tunneling dielectric layer 112, the charge storage layer 113, and the block dielectric layer 114 form a stack structure around the core.

In this implementation, the top selection transistor TSG and the bottom selection transistor BSG, the memory transistors M1 to M4 use a common channel region 111 and a block dielectric layer 114. A channel region 111 in a channel post 110 provides a source and drain region and a channel region of a plurality of transistors. In an alternative implementation, the semiconductor layers and block dielectric layers of the top selection transistor TSG and the bottom selection transistor BSG and the semiconductor layers and block dielectric layers of the memory transistors M1 to M4 may be formed in steps separately.

Figure 5:
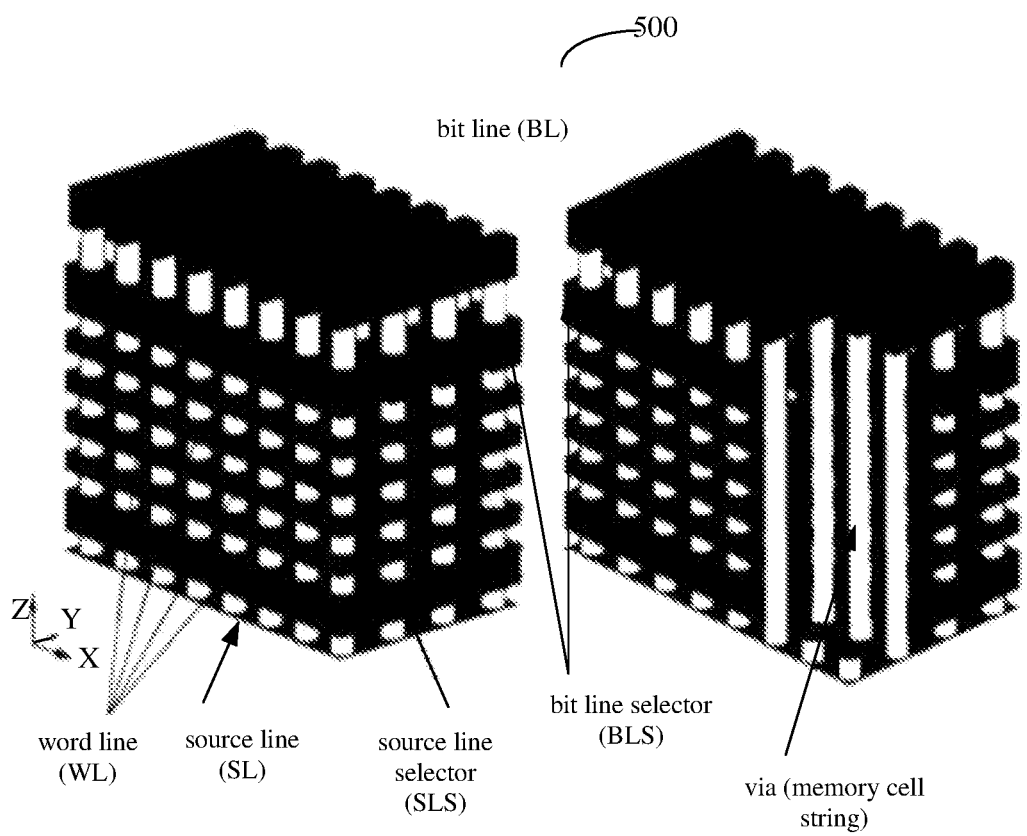
FIG. 5 is an exemplary structure diagram of a single memory block in a 3D memory provided according to an implementation of the present disclosure.

As shown in FIG. 5, which shows a schematic structural diagram of a 3D memory array of a single memory block provided by an implementation of the present disclosure. Referring to FIG. 5, the memory block 500 comprises a plurality of layers stacked on a substrate (not shown) and parallel to the surface of the substrate. FIG. 5 shows four word lines (WL) on four layers, which may be referred to as WL0 to WL3. The memory block 500 is also provided with a plurality of vias perpendicular to the word lines. The intersection of a word line and a via forms a memory cell, so a via can also be referred to as a memory cell string. It should be understood by those skilled in the art that the number of word lines and the number of memory cell strings of the memory block 500 are not limited to specific values. For example, the memory block 500 may include 64 word lines, and the 64 word lines cross with one memory cell string to form 64 memory cells along the memory cell string. For example, the number of memory cell strings included in the memory block 500 may be counted on the order of one hundred thousand, millions or even greater. One word line includes millions of memory cells formed by crossing with, for example, millions of memory cell strings. The memory cell in the memory block 5 may be a single-level memory cell or a multi-level memory cell. The single-level memory cell may be a single-level cell (SLC) capable of storing one bit (bit); the multi-level memory cell may be a multi-level unit (MLC) capable of storing 2 bits, a triple-level unit (TLC) capable of storing 3 bits, a four-level unit (QLC) capable of storing 4 bits, and a five-level unit (PLC) capable of storing 5 bits. As shown in FIG. 5, the memory block 500 further includes a bit line (BL), a bit line selector (BLS, also referred to as a string selection line SSL), a source line (SL), a source selection line (SLS, also referred to as a ground selection line GSL). These lines, together with the word line (WL), enable addressing of any memory cell in the memory block 500.

Figure 6:
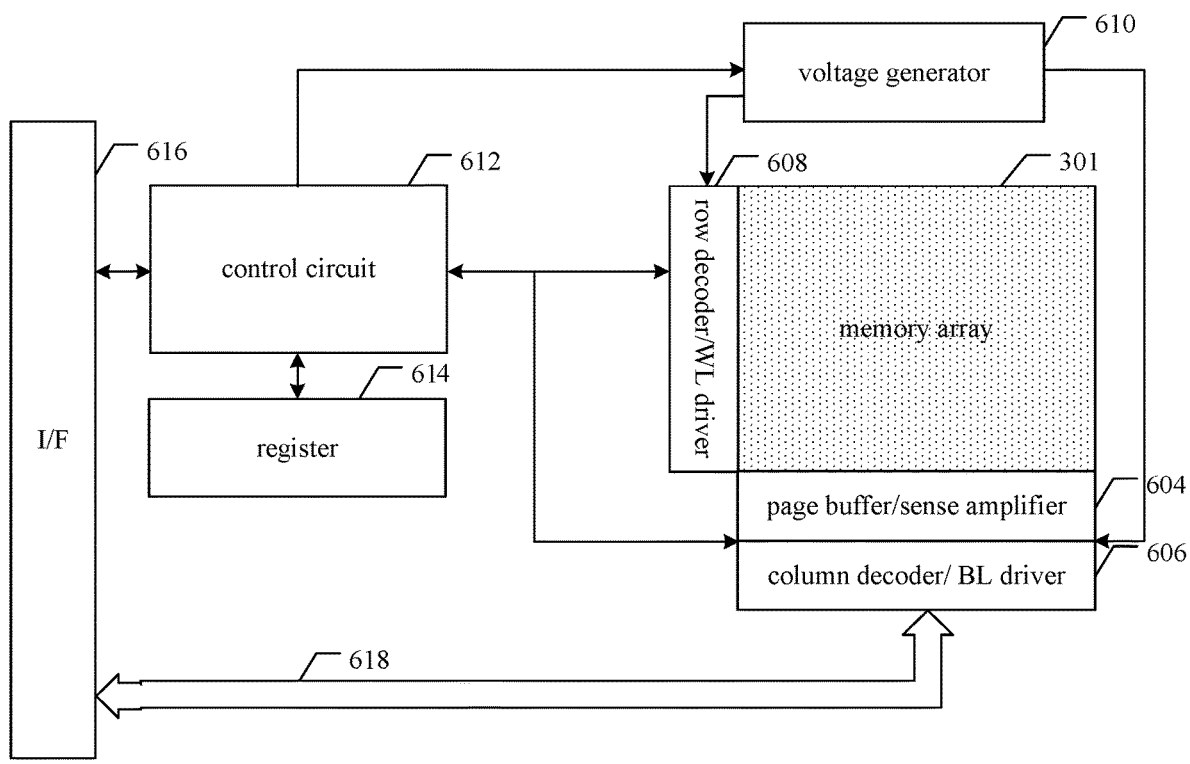
FIG. 6 is a block diagram of an exemplary memory including a memory array and peripheral circuit provided according to implementations of the present disclosure.

Referring back to FIG. 3, the peripheral circuit 302 may be coupled to memory array 301 via bit line 316, word line 318, source line 314, SSG line 315, and DSG line 313. The peripheral circuit 302 may include any suitable analog, digital and mixed-signal circuit for facilitating operation of memory array 301 by applying voltage and/or current signals to each target memory transistor 306 and sensing voltage and/or current signals from each target memory transistor 306 via bit lines 316, word lines 318, source lines 314, SSG lines 315 and DSG lines 313. The peripheral circuit 302 may include various types of peripheral circuits formed using metal-oxide-semiconductor (MOS) technology. For example, FIG. 6 shows some exemplary peripheral circuits. The peripheral circuit 302 includes page buffer/sense amplifier 604, column decoder/bit line driver 606, row decoder/WL driver 608, voltage generator 610, control circuit 612, register 614, interface 616, and data bus 618. It should be understood that additional peripheral circuits not shown in FIG. 6 may also be included in some examples.

The page buffer/sense amplifier 604 may be configured to read data from and program (write) data to the memory array 301 according to a control signal from the control circuit 612. In one example, the page buffer/sense amplifier 604 may store one page of programming data (writing data) to be programmed into one page 320 of the memory array 301. In another example, the page buffer/sense amplifier 604 may perform a program verification operation to ensure that data has been correctly programmed into the memory transistor 306 coupled to the selected word line 318. In yet another example, the page buffer/sense amplifier 604 may also sense a low power signal from the bit line 316 representing the data bits stored in the memory transistor 306, and amplify the small voltage swing to a recognizable logic level during a read operation. The column decoder/bit line (BL) driver 606 may be configured to be controlled by control circuit 612 and to select one or more NAND memory cell strings 308 by applying a bit line voltage generated from voltage generator 610.

The row decoder/WL driver 608 may be configured to be controlled by the control circuit 612 to select/deselect a memory block 304 of the memory array 301 and to select/deselect a word line 318 of the memory block 304. The row decoder/WL driver 608 may also be configured to drive the word line 318 using the word line voltage generated from the voltage generator 610. In some implementations, the row decoder/word line (WL) driver 608 may also select/deselect and drive SSG Line 315 and DSG Line 313. The row decoder/WL driver 608, described in detail below, is configured to perform an erase operation on the memory transistor 306 coupled to the selected word line(s) 318. The voltage generator 610 may be configured to be controlled by the control circuit 612 and generate word line voltages (e.g., read voltage, program voltage, pass voltage, local voltage, verification voltage, etc.), bit line voltages and source line voltages to be supplied to the memory array 301.

The control circuit 612 may be coupled to each peripheral circuits described above and configured to control the operation of each peripheral circuit. The register 614 may be coupled to the control circuit 612 and includes a status register, command register, and an address register for storing a status information, command opcode (OP code), and a command address for controlling the operation of each peripheral circuit. The interface 616 may be coupled to the control circuit 612 and act as a control buffer to buffer and relay control commands received from a host (not shown) to the control circuit 612, and buffer and relay status information received from the control circuit 612 to the host. The interface 616 may also be coupled to the column decoder/bit line driver 606 via the data bus 618 and act as a data I/O interface and a data buffer to buffer and relay data to or from the memory array 301.

Figure 7:
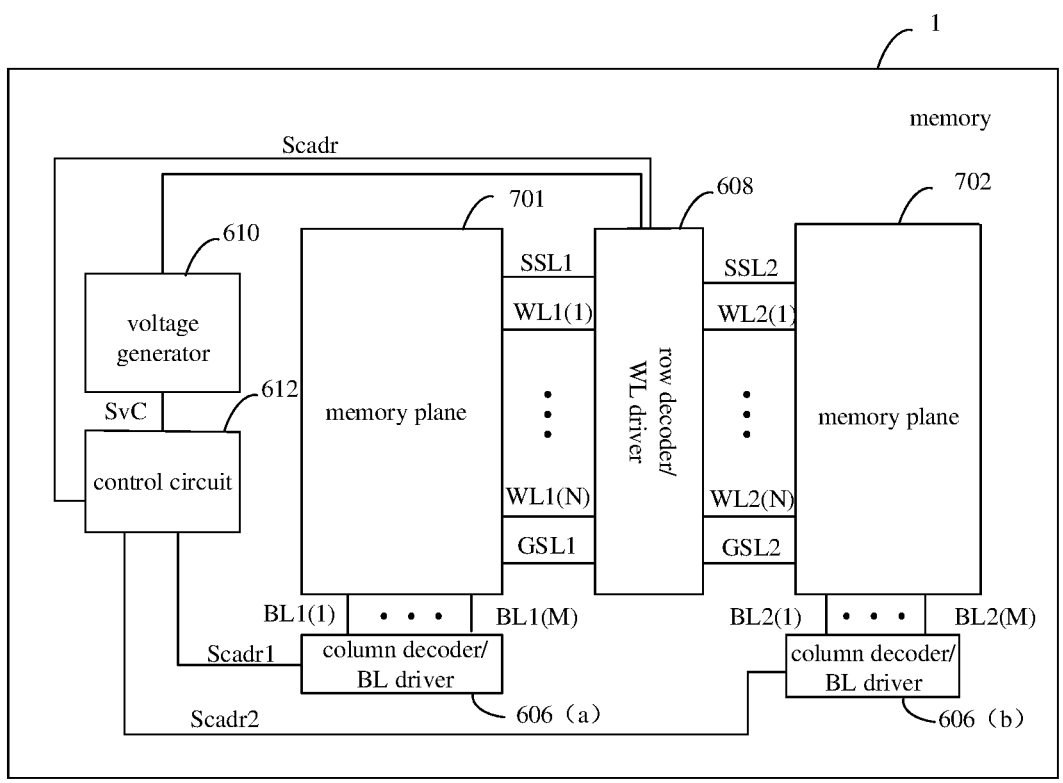
FIG. 7 is a schematic diagram of the structure of a memory including two memory planes provided according to an implementation of the present disclosure.

In practical applications, the memory array 301 may include a plurality of memory planes, each of which includes a plurality of memory blocks, and each of which includes a plurality of memory pages. A memory page is the smallest unit of reading and writing (i.e., programming), while a memory block is the smallest unit of erasing. As shown in FIG. 7, which shows a schematic structure diagram of a memory including two memory planes provided by an implementation of the present disclosure. The structure may also include peripheral circuits. The peripheral circuits may include a control circuit 612, a voltage generator 610, a row decoder/WL driver 608, a column decoder/BL driver 606(a), 606(b). The memory planes include memory planes 701, 702. Although a dual memory plane structure is used in this implementation, it should be understood that other numbers of memory planes may be employed within the scope of the present disclosure. In the multi-plane programming mode, the memory planes 701, 702 can be programmed at the same time.

In practice, the control circuit 612 may be coupled to a voltage generator 610, a row decoder/WL driver 608, and a column decoder/BL driver 606(a), 606(b). The voltage generator 610 may be coupled to row decoder/WL driver 608. The row decoder/WL driver 608 may be coupled to the memory plane 701 via a string selection line SSL1, word lines WL1(1) to WL1(N), and a ground selection line GSL1, where N is a positive integer, for example, N=128. The row decoder/WL driver 608 may be coupled to the memory plane 702 via a string selection line SSL2, word lines WL2(1) to WL2(N), and a ground selection line GSL2. The column decoder/BL driver 606 may be coupled to memory plane 701 via bit lines BL1(1) to BL1(M), where M is a positive integer, for example, M=131072. The column driver 132 may be coupled to memory plane 702 via bit lines BL2(1) to BL2(M). Each memory plane 701, 702 may contain a plurality of memory blocks, each of which may contain a plurality of memory pages, and each of which may contain a plurality of memory cells. The memory cells in the memory plane 701 may be addressed by word lines WL1(1)

to WL1(N) and bit lines BL1(1) to BL1(M), and the memory cells in the memory plane 702 may be addressed by word lines WL2(1) to WL2(N) and bit lines BL2(1) to BL2(M).

The control circuit 612 may communicate with a host or a memory controller to receive data for storage in the memory planes 701, 702 and transmit data retrieved from the memory planes 701, 702. The control circuit 612 may receive commands, addresses, or data from a host or a memory controller and generate column address signals Scadr1, Scadr2, row address signals Sradr, and voltage control signals Svc. In response to the voltage control signal Svc from the control circuit 612, the voltage generator 610 may generate voltages for read, program, erase and verify operations. The voltage generated by the voltage generator 610 may exceed the power supply voltage supplied to the memory 1. The row decoder/WL driver 608 may operate in response to the row address signal Sradr from the control circuit 612 to select word lines for read, program, erase and verify operations. The column decoder/BL drivers 606(*a*), 606(*b*) may operate in response to column address signals Scadr1, Scadr2 from control circuit 612 to generate bit line signals to select bit lines for read, program, erase, and verify operations.

In programming operations, the voltage generator 610 may use a supply voltage (e.g., 3.3 V) to generate a program voltage (e.g. 20 V) and a program pass voltage (e.g., 10 V). The row decoder/WL Driver 608 may apply a program pulse having an amplitude of a program voltage to a selected word line, a program pass voltage to the unselected word lines, a supply voltage to the string selection lines SSL1, SSL2, and a ground voltage to the ground selection lines GSL1, GSL2. The column decoder/BL drivers 606(*a*), 606(*b*) may apply a ground voltage (e.g., 0 V) to the selected bit lines and a supply voltage to the unselected bit lines. In the verification operation, the voltage generator 610 may generate an appropriate verification voltage. The row decoder/WL driver 608 may apply the appropriate verification voltage to the selected word line, the power supply voltages to the string selection lines SSL1, SSL2, and the power supply voltages to the ground selection lines GSL1, GSL2. The column decoder/BL drivers 606(*a*), 606(*b*) may apply the ground voltage to the unselected bit lines and apply the power supply voltages to the selected bit lines of the memory planes 701, 702, respectively, to read data from the selected memory cells on the selected bit lines. If the data read is incorrect, the control circuit 612 may verify the selected memory cell as failed, and if the data read is correct, the control circuit 612 may verify the selected memory cell as passed.

The memory cell may be of Single-Level Cell (SLC) type, Multi-Level Cell (MLC) type, Triple-Level Cell (TLC) type, Quad-Level Cell (QLC) type, Penta-Level Cell (PLC) type or higher. Each memory cell may hold one of Q possible data states, where Q is a positive integer equal to or greater than 2. For example, for SLC, Q=2; for MLC, Q=4; for TLC Q=8; for QLC Q=16; and for PLC, Q=32. The Q possible data states may include an erased state S(0) and program states S(1) to S(Q-1), where program state S(1) is the lowest program state, and program state S(Q-1) is the highest program state. In one example, the TLC can be programmed into one of eight possible data states, where program state S(1) is the lowest program state, and program state S(7) is the highest program state.

The memory cell may be initially set to an erased state S(0) and a series of program verification operations may be performed on the memory cell later to program it to a corresponding target program state. A series of program verification operations may start from the lowest program state S(1), and then proceed to the higher program state, until the threshold voltage of the selected memory cell reaches the corresponding verification voltage level of the corresponding target program state. In some implementations, the verification voltage may be selected as the minimum threshold voltage of the threshold voltage distribution curve of the program states S(1) to S(Q-1), respectively. Each program verification operation may include a program operation and a subsequent verification operation. Some of the memory cells may be selected in the program operation and programmed into the program state in a line-by-line manner from the first line to the Nth line or from the Nth line to the first line.

In actual use, there are various defects in the 3D NAND memory in the memory system. Some defects can be detected when leaving the factory, and some defects are exposed as the use environment changes after leaving the factory. In practical applications, there may be structural weak points in some memory cell arrays of 3D NAND memory, and these structural weak points may take a long time or a large number of program operations and erase operations before developing and becoming defects. For example, the memory cell array of the 3D NAND memory needs to withstand high-pressure stress during programming and erasing cycles, and weak structures in some memory cell arrays of the 3D NAND memory will develop into defects after cycling.

When there are defects in the 3D NAND memory, these defects may not affect the successful execution status that the erase operation and program operation fed back. That is, the existence of these defects can also be the status of the successful execution that the erase operation and program operation have returned. However, the written data may have been abnormal, resulting in UECC of the read operation, which in turn causes data loss.

From research, it is found that in the application of 3D NAND flash memory, when the data system is writing data, programming status failed (PSF) will occur due to defects such as word line leakage (WL lkg). Especially the case when performing multi-plane programming. If a certain block in a plane causes PSF due to the existence of this WL lkg, this leakage will affect the voltage on the x-path in the entire multi-plane programming operation (generally, the voltage applied to the word line can be called the voltage on the x-path). That is, if the voltage applied to the word line is affected, the data in the memory cells corresponding to the entire WL may be destroyed. Since each WL may correspond to memory cells of multiple character string, a large amount of data may be lost, which may cause failures in the memory system. This type of failure is generally defined as a reliability failure of a 3D NAND type memory, which may further cause a failure of the memory system in the field.

Figure 8:
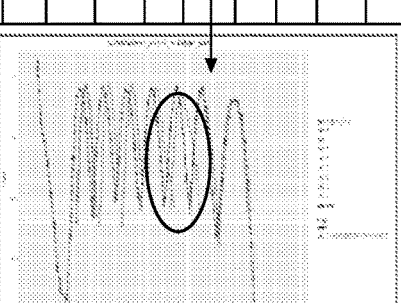
FIG. 8 is a schematic diagram of an NPD phenomenon occurring when a memory performs a programming operation in the related art.

In 3D NAND-type memories, the internal voltage bias power supply is usually shared between different planes during program operations in order to save circuit area and power consumption. If one memory plane is defective, the other memory planes that share the internal voltage bias supply may not reach the target level. That is, a PSF in one memory plane will also affect the voltages on x-path in other adjacent memory planes, thus affecting the written data in other adjacent memory planes. Therefore, even if only one plane has physical defects, UCEE in read operations often occurs on multiple memory planes. This phenomenon may be called Neighbor Plane Disturb (NPD). Obviously, NPD will cause data loss. Refer to FIG. 8 for details. In FIG. 8, when PSF occurs in Str3 in word line WLn of Plane0, the distribution of the threshold voltages of memory cells contained in string3 in word line WLn of adjacent Plane1, Plane2, and Plane3 become abnormal, causing UECC, thereby causing data loss. It should be noted that Str0-Str5 in FIG. 8 represent memory sub-blocks in Plane0, Plane1, Plane2, and Plane3.

In order to avoid UECC of data caused by PSF, the memory system may use redundant array of independent disks (RAID) or host memory buffer (HMB) to recover lost data, but these methods are harmful to the entire system's performance. For example, a general memory system adopts a plane-level RAID, which can only recover a failure of one memory plane. If programming fails on multiple memory planes, the memory system will not be able to recover the data. For such failures, the memory system can perform RAID at the die level, but the configuration cost of the memory system will increase. Especially in order to solve the NPD phenomenon mentioned above, the data system needs to consume large resources to back up the data being written, because the range of WL/Str (String, memory sub-block) that causes data loss is relatively large, thus impacting the data system performance negatively. Moreover, not all memory controllers or firmware (FW) have their own system solutions to solve the NPD problem, which inevitably leads to data loss.

Figure 9:
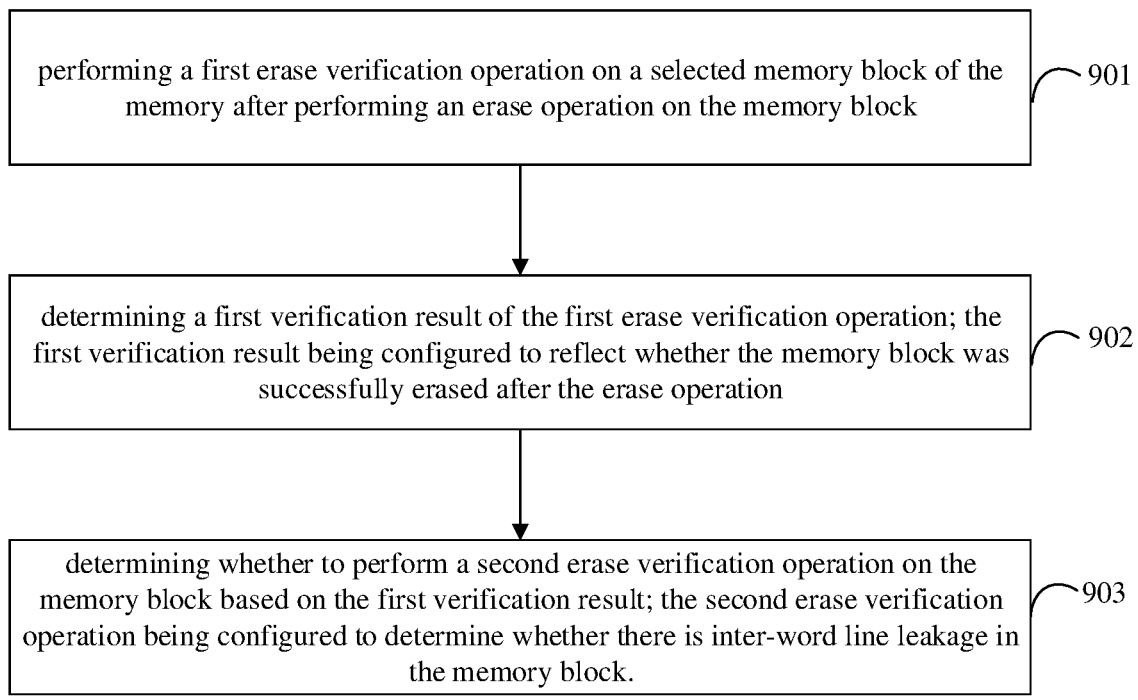
FIG. 9 is a schematic flow diagram of an implementation of an erase verification method of a memory provided according to an implementation of the present disclosure.

In order to solve the above technical problems, the implementation of the present disclosure provides an erase verification method for a memory device, as shown in FIG. 9, which shows a schematic flow diagram of the implementation of the erase verification method for the memory device provided by the implementation of the present disclosure. In particular, the erase verification method may include the following:

Step 901: performing a first erase verification operation on a selected memory block of the memory after performing an erase operation on the memory block;

Step 902: determining a first verification result of the first erase verification operation; the first verification result is configured to reflect whether the memory block was successfully erased after the erase operation;

Step 903: determining whether to perform a second erase verification operation on the memory block based on the first verification result; the second erase verification operation is configured to determine whether there is inter-word line leakage in the memory block.

The memory herein comprises a plurality of memory blocks. The erase verification method is performed for a selected memory block in the memory. It is understood that the selected memory block may comprise at least one memory block, i.e., the number of selected memory blocks may be one or more.

In Step 901, the first erase verification operation may be performed after the erase operation has been performed on the selected memory block, and is configured to verify whether the memory block has been successfully erased after the erase operation.

In some implementations, the first erase verification operation includes applying an erase verification voltage to the memory block to sense a signal to be verified corresponding to the erase verification voltage; determining a first verification result of the first erase verification operation based on the signal to be verified.

In some implementations, the memory includes a plurality of memory blocks; each memory block includes a plurality of memory cells and a plurality of word lines respectively coupled to the plurality of memory cells; applying an erase verification voltage to the memory block may include:

applying the erase verification voltage to the plurality of word lines in the memory block using the same or different voltage sources.

It should be noted that it has been described that a memory block can be divided into a plurality of memory sub-blocks (String). Based on this, when performing a first erase verification operation on the memory block together with the memory cells in a String, each String in the memory block may be sequentially verified. The erase verification voltage needs to be applied to all the word lines WL in a String when performing a first erase verification operation on the memory cells in the String, and then a signal to be verified is obtained by sensing by a sense amplifier, based on which to verify whether the erase operation is successful. It should be noted that the signal to be verified may be a voltage signal or a current signal.

A voltage source for applying the erase verification voltage to a plurality of word lines contained in each String in the memory block may be the same or different, which is arranged according to the specific structure of the memory, and is not limited here.

A first verification result of the first erase verification operation is determined after the first erase verification operation is performed for each String in the memory, i.e., Step 902. The first verification result is the status fed back after the first erase operation is performed after the erase operation is completed as described above. The first verification result is configured to reflect whether the memory block is successfully erased after the erase operation in the actual application.

In Step 903, determining whether to perform a second erase verification operation on the memory block based on the first verification result may include: determining to perform the second erase verification operation on the memory block when the first verification result is configured to indicate that the memory block was successfully erased after the erase operation; and determining not to perform the second erase verification operation on the memory block when the first verification result is configured to indicate that the memory block was not successfully erased after the erase operation.

Here, whether a second erase verification operation needs to be performed is determined according to whether the erase operation is performed successfully: determining to perform the second erase verification operation on the memory block when the first verification result is configured to indicate that the memory block was successfully erased after the erase operation; determining not to perform the second erase verification operation on the memory block when the first verification result is configured to indicate that the memory block was not successfully erased after the erase operation.

In some implementations, the erase verification method further comprises: performing the second erase verification operation on the memory block when it is determined to perform the second erase verification operation on the memory block; and determining a second verification result of the second erase verification operation; the second verification result is configured to reflect whether there is inter-word line leakage in the memory block.

The second erase verification operation herein may be an inter-word line leakage detection operation in the memory block. That is, when determining to perform the second erase verification operation on the memory block, performing the second erase verification operation on the memory block, and determining a second verification result of the second erase verification operation; the second verification result is configured to reflect whether there is inter-word line leakage in the memory block. That is, it is determined whether there still is inter-word line leakage after the selected memory is erased successfully with the second erase verification operation.

In some implementations, the erase verification method further comprises: saving a first flag when the first verification result is configured to indicate that the memory block was not successfully erased after the erase operation or when the second verification result is configured to indicate that there is inter-word line leakage in the memory block; the first flag is configured to indicate that the memory block is a bad block.

In some implementations, the erase verification method further comprises: saving a second flag when the second verification result is configured to indicate that there is no inter-word line leakage in the memory block; the second flag is configured to indicate that the memory block is an available block.

It should be noted that the bad block described herein may be a memory block that cannot continue programming operations later. The available block may be a memory block that can be programmed later.

In some implementations, the first flag or the second flag is stored in a register in the memory. The register may be a status register.

For a second erase verification operation, in some implementations, the second erase verification operation may be performed by an inter-word line leakage detection circuit built in the memory.

Specifically, in some implementations, the second erase verification operation may include: applying a leakage detection voltage to a word line to be detected in the memory block to detect a residual voltage of the word line to be detected after a preset time; comparing the residual voltage and the reference voltage to obtain a comparison result; determining the second verification result based on the comparison result.

In some implementations, applying a leakage detection voltage to a word line to be detected in the memory block to detect a residual voltage of the word line to be detected after a preset time may comprise: applying a leakage detection voltage to the word line to be detected; grounding the word line adjacent to the word line to be detected; stopping applying the leakage detection voltage to the word line to be detected when the leakage detection voltage of the word line to be detected reaches a predetermined value; and detecting the residual voltage of the word line to be detected after the preset time.

In some implementations, determining the second verification result based on the comparison result may comprise: determining that the second verification result is configured to indicate that there is no leakage between the word line to be detected and adjacent word line in the memory block when the comparison result is that the absolute value of the difference between the residual voltage and the reference voltage is less than a preset threshold; and determining that the second verification result is configured to indicate there is leakage between the word line to be detected and adjacent word line in the memory block when the comparison result is that an absolute value of the difference between the residual voltage and the reference voltage is not less than the preset threshold.

Figure 10A:
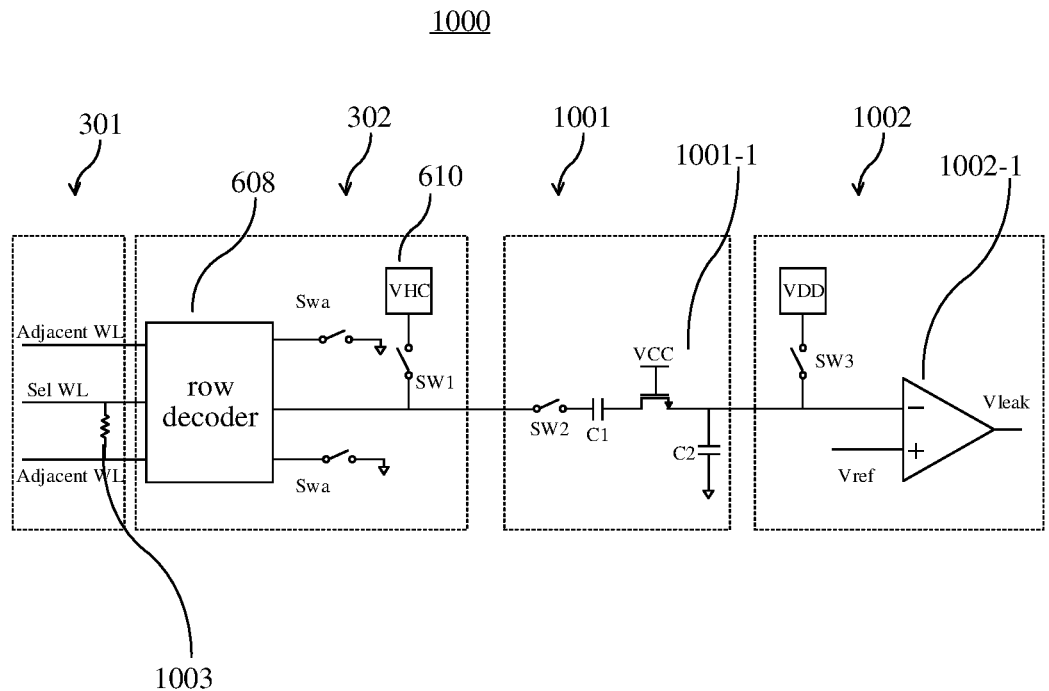
FIGS. 10(a) and 10(b) are schematic diagrams of a connection relationship between inter-word-line leakage detection circuit and word line and bit line inter-leakage detection circuit and a memory array peripheral circuit provided according to an implementation of the present disclosure.
Figure 10B:
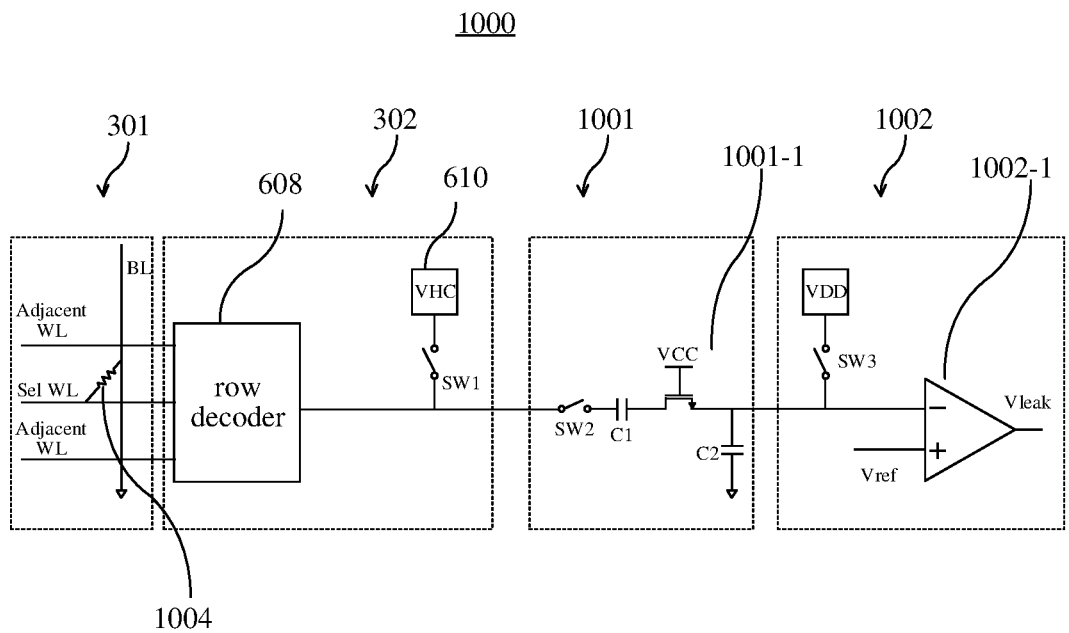

It should be noted that the inter-word line leakage detection circuit may be a part of the peripheral circuit. See FIG. 10(a) and FIG. 10(b) for specific circuit structures. FIG. 10(a) shows a schematic diagram of a connection relationship between a structure circuit of an inter-word line leakage detection circuit and a word line to be detected for measuring leakage between the word line to be detected and the adjacent word line provided in the present disclosure; FIG. 10(b) is a schematic diagram showing a connection relationship between a structure circuit of an inter-word line leakage detection circuit and a word line to be detected for measuring leakage between the word line to be detected and a bit line provided in the present disclosure.

It should be noted that in FIGS. 10(a) and 10(b), Sel WL is a word line to be detected; the Adjacent WL and Sel WL are adjacent word lines. An equivalent resistance 1003 located between the word line to be detected Sel WL and the Adjacent WL represents a leakage path between the word line to be detected Sel WL and the Adjacent WL. The equivalent resistance 1003 corresponds to a short circuit state when a leakage occurs between the word line to be detected Sel WL and the Adjacent WL. When there is no abnormality between the word line to be detected Sel WL and the Adjacent WL, the equivalent resistance 1003 corresponds to an open circuit state. The equivalent resistance 1004 between the word line to be detected Sel WL and the bit line BL represents the leakage path between the word line to be detected Sel WL and the bit line BL. The bit line BL corresponds to a short circuit state when leakage occurs between the word line to be detected Sel WL and the bit line BL. When there is no abnormality between the word line to be detected Sel WL and the bit line BL, the equivalent resistance 1004 corresponds to an open circuit state.

As shown in FIGS. 10(a) and 10(b), the inter-word line leakage detection circuit may include an isolation module 1001 including an electronic switch SW2, high-voltage isolation capacitor C1, Clamp electrostatic protection assembly 1001-1, and a comparison module 1002 including a voltage source VDD, electronic switch SW3, and a comparator 1002-1.

It should be noted that the leakage detection voltage applied to the word line to be detected is generated by the aforementioned voltage generator 610. In particular, the inter-word line leakage detection circuit may couple the driving voltage to the word line to be detected through the electronic switch SW1 and the row decoder in response to the leakage detection instruction signal.

Here, the inter-word line leakage detection circuit may also couple the isolation module to the word line to be detected and the comparison module in response to the leakage detection instruction signal. The electronic switch SW2 in the isolation module couples the isolation module to the word line to be detected. The high-voltage isolation capacitor C1 in the isolation module may effectively isolate the comparison module (the inter-word line leakage detection circuit) and the voltage generator (word line working circuit, the applying voltage circuit erased or programmed) to realize the switching between the high-voltage working mode and the low-voltage leakage detection mode of the word line to be detected. The numerical range of the high-voltage isolation capacitor C1 may be determined by the voltage coupling rate and the size of the memory array.

Further, a Clamp electrostatic protection assembly 1001-1 is arranged between the high-voltage isolation capacitor C1 and the comparator. The Clamp electrostatic protection assembly 1001-1 has strong current discharge capability. With the transient characteristic of the capacitor of the Clamp electrostatic protection assembly, when the electrostatic voltage is applied to the Clamp electrostatic protection assembly 1001-1, the RC time constant (1 microsecond or more) is too long than the loading time of the electrostatic voltage (10 nanoseconds or so). Therefore, the transient effect of the capacitor is very obvious, causing the voltage at the input of the comparator cannot be raised immediately, which may effectively prevent the failure of the SOA (Safe Operating Area) of the comparator. Thus, the comparator may be protected.

The comparator 1002-1 in the comparison module 1002 is configured to determine a difference between the reference voltage and the voltage of the word line to be detected. The difference is compared with a preset threshold, thereby determining whether there is a leakage between the word line to be detected and the adjacent word line, that is, determining a second verification result of the second erase verification. The voltage of the word line to be detected received by the comparator 1002-1 is a residual voltage on the word line to be detected for a preset time. The reference voltage is supplied by the reference voltage source Vref. Specifically, after receiving the leakage detection instruction signal, the control circuit controls the row decoder to apply leakage detection voltage to the word line to be detected through the voltage generator, and grounds the word line adjacent to the word line to be detected. Then, when the leakage detection voltage of the word line to be detected reaches a predetermined value, the application of the leakage detection voltage to the word line to be detected is stopped. After the preset time, the residual voltage of the word line to be detected is detected. The residual voltage detected at this time is the voltage to be compared with the reference voltage.

Then, according to the difference between the residual voltage and the reference voltage, it is determined whether there is leakage between the word line to be detected and the adjacent word line in the memory block. The preset threshold and the reference voltage may be empirical values.

Here, the procedure for specifically measuring the residual voltage of the word line to be detected is as follows: when the leakage detection voltage applied to the word line to be detected by the voltage generator 610 reaches a predetermined value, the application of the leakage detection voltage to the word line to be detected is stopped. The electronic switch SW3 is turned on, C1 is charged through VDD to make its voltage reach VDD, and then the electronic switch SW3 is turned off. During the floating process of the word line to be detected, the potential of the parallel plate on the left side of C1 is changed due to the change of the voltage on the word line to be detected, and the potential of the parallel plate on the right side of C1 is also changed through the coupling effect. After a preset time, the potential of the parallel plate on the right side of C1 is changed from VDD to a lower potential, which is also the residual voltage.

It should be noted that FIGS. 10(*a*) and 10(*b*) show the detection of leakage current between word lines for only one word line to be detected. In fact, since the components in the inter-word-line leakage detection circuit provided by the present disclosure are all realized by low-voltage devices, the area of the circuit itself is small. A plurality of the inter-word-line leakage detection circuits can be arranged in the memory to realize simultaneous detection of the inter-word-line leakage of a plurality of word lines to be detected.

In some implementations, the erasure verification method also includes determining to perform the second erase verification operation on word lines of a predetermined range in the memory block when the first verification result is configured to indicate that the memory block was successfully erased after the erase operation.

It should be noted that, after research, it is found that when the memory is erased, inter-word line leakage will occur due to process defects. Due to the characteristics of the existing process, according to the TAS DPPM test, most of the leakage word line in the memory is WL0, where WL0 is the first word line in the memory to perform programming operations. In order to save detection time, only high-risk word lines may be detected, for example, word line WL0. The predetermined range may be freely set by a designer.

In order to detect only word lines within a set range, a set of registers may be added to the memory controller, for example, registers used to control whether the leakage detection circuit between word lines is turned on, for example, registers used to store the start address and end address of a range of preset word lines, and so on.

An implementation of the present disclosure provides an erasure verification method. By determining the first verification result of the first erasure verification operation, it is determined whether the memory block on which the erase operation has been performed has been successfully erased, and then according to the first verification result, it is determined whether to perform the second erase verification operation on the memory block to detect whether there is inter-word line leakage in the memory block (it has been found from research that the inter-word line leakage is the main factor leading to data discarding). Through the verification operation of the present disclosure, it is possible to effectively detect whether the memory block is a bad block, so as to effectively avoid data loss caused by abnormalities in subsequent programming operations. In this way, in multi-plane programming, programming exceptions may be limited to the memory planes that have abnormalities themselves, reducing the impact of programming exceptions on other normal memory planes, i.e., reducing the adverse effects of neighbor plane disturb, that is, reducing the probability of occurrence of NPD phenomenon.

Figure 11:
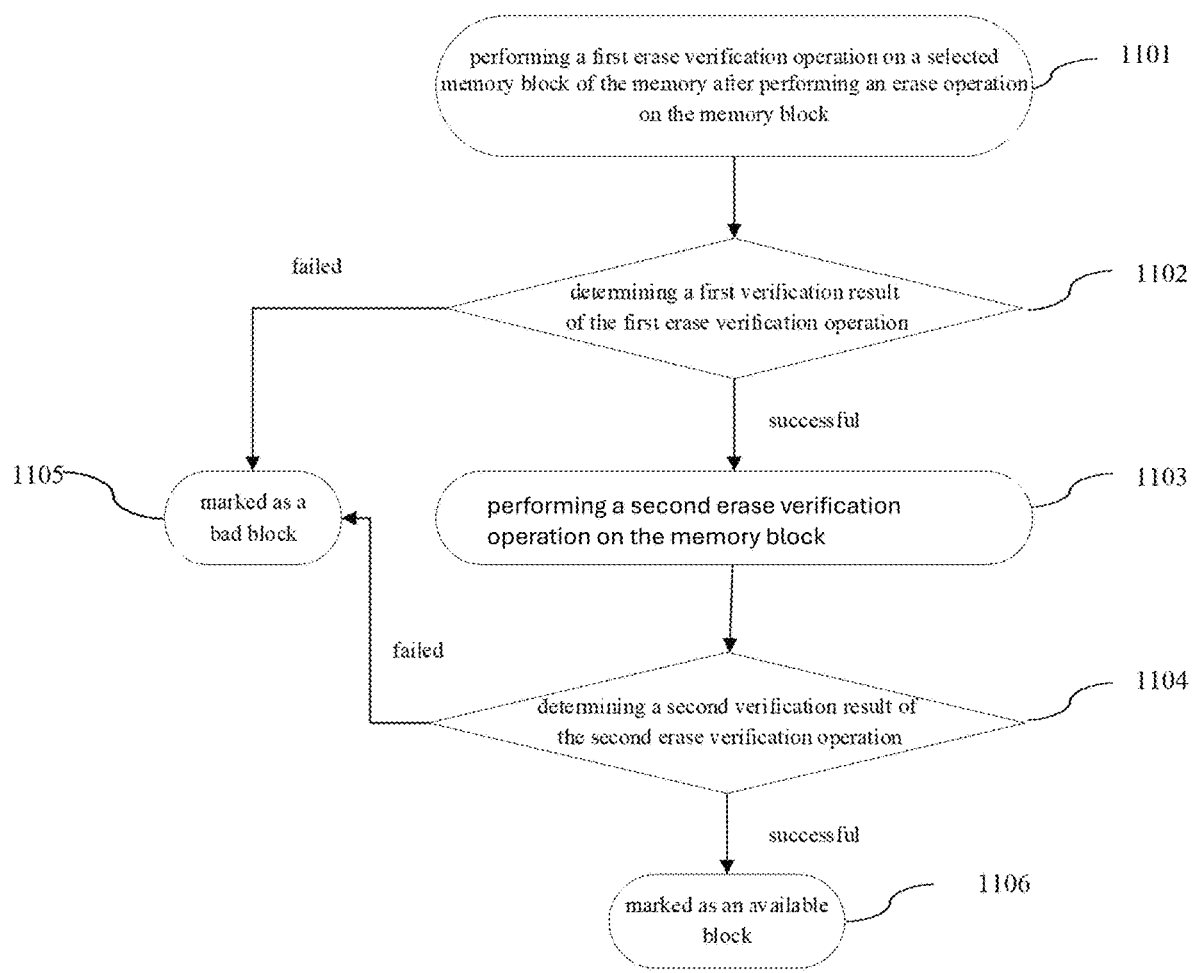
FIG. 11 is a schematic flow diagram of an implementation of an erase verification method of a memory provided according to an implementation of the present disclosure.

In order to understand the disclosure, FIG. 11 shows a schematic flow of the erase verification method applied to the memory provided by an implementation of the present disclosure.

As shown in FIG. 11, the erase verification method is applied to the memory side and may specifically include the following:

Step 1101: performing a first erase verification operation on a selected memory block in the memory after an erase operation performed on the memory block;

Step 1102: determining a first verification result of the first erase verification operation; wherein, going to Step 1103 when the first verification result is configured to indicate that the memory block has been successfully erased after the erase operation; going to Step 1105 when the first verification result is configured to indicate that the memory block was not successfully erased after the erase operation;

Step 1103: performing a second erase verification operation on the memory block;

Step 1104: determining a second verification result of the second erase verification operation; going to Step 1106 when the verification result is configured to indicate that there is no inter-word line leakage in the memory block; going to Step 1105 when the verification result is configured to indicate that there is inter-word line leakage in the memory block;

Step 1105: saving the first flag; the first flag is configured to indicate the memory block is a bad block;

Step 1106: saving the second flag; the second flag is configured to indicate the memory block is an available block.

In this case, the second erase verification operation is started only when the first erase verification of the memory block is successful. This not only saves the verification time, but also can identify which memory blocks have failed programming due to inter-word line leakage.

It should be noted that when the determined first verification result is configured to indicate that the memory block has not been successfully erased after the erase operation, determine whether the erase operation currently performed has reached a maximum number of erases. If it is determined that the erase operation currently performed has not reached the maximum number of erases, continue to perform the erase operation and a first erase verification operation until the maximum number of erases is reached. If it is determined that the erase operation currently performed has reached the maximum number of erases, determine to mark the memory block as a bad block. Because the memory block contains a lot of memory cells, different memory cells are slightly different in structure, and the state of memory cells is also different. Some memory cells may be erased successfully at one time, and some memory cells require multiple times. Therefore, a maximum number of erases can be set to accurately identify whether a memory block is bad or not.

The present disclosure also provides an operation method of the memory. In particular, the operation method may include performing an erase operation on a selected memory block in the memory; an performing any one of the above erase verification method on the memory to determine whether there is inter-word line leakage in the memory block.

In some implementations, the operation method further comprises: if the first verification result as a feedback is configured to indicate that the memory block is not successfully erased after the erase operation, determining whether the erase operation currently performed has reached a maximum number of erases; if it is determined that the erase operation currently performed has not reached the maximum number of erases, continuing to perform the erase operation and a first erase verification operation until the maximum number of erases is reached; and if it is determined that the erase operation currently performed has reached the maximum number of erases, determining to mark the memory block as a bad block.

It should be noted that the aforementioned erase verification method may be an erase verification step in the operation method. Therefore, the operation method here and the aforementioned erase verification method are methods of the same inventive concept. The nouns that appear here have been described above and not repeated.

Here, the maximum number of erases may be artificially set according to actual conditions. For example, the maximum number of erases may be 5 or 6 and the like.

That is, when the maximum number of erases has not been reached, the erase operation on the memory is continued until the maximum number of erases is reached. If the the first verification result as a feedback still fails, the memory block is marked as a bad block.

Figure 12:
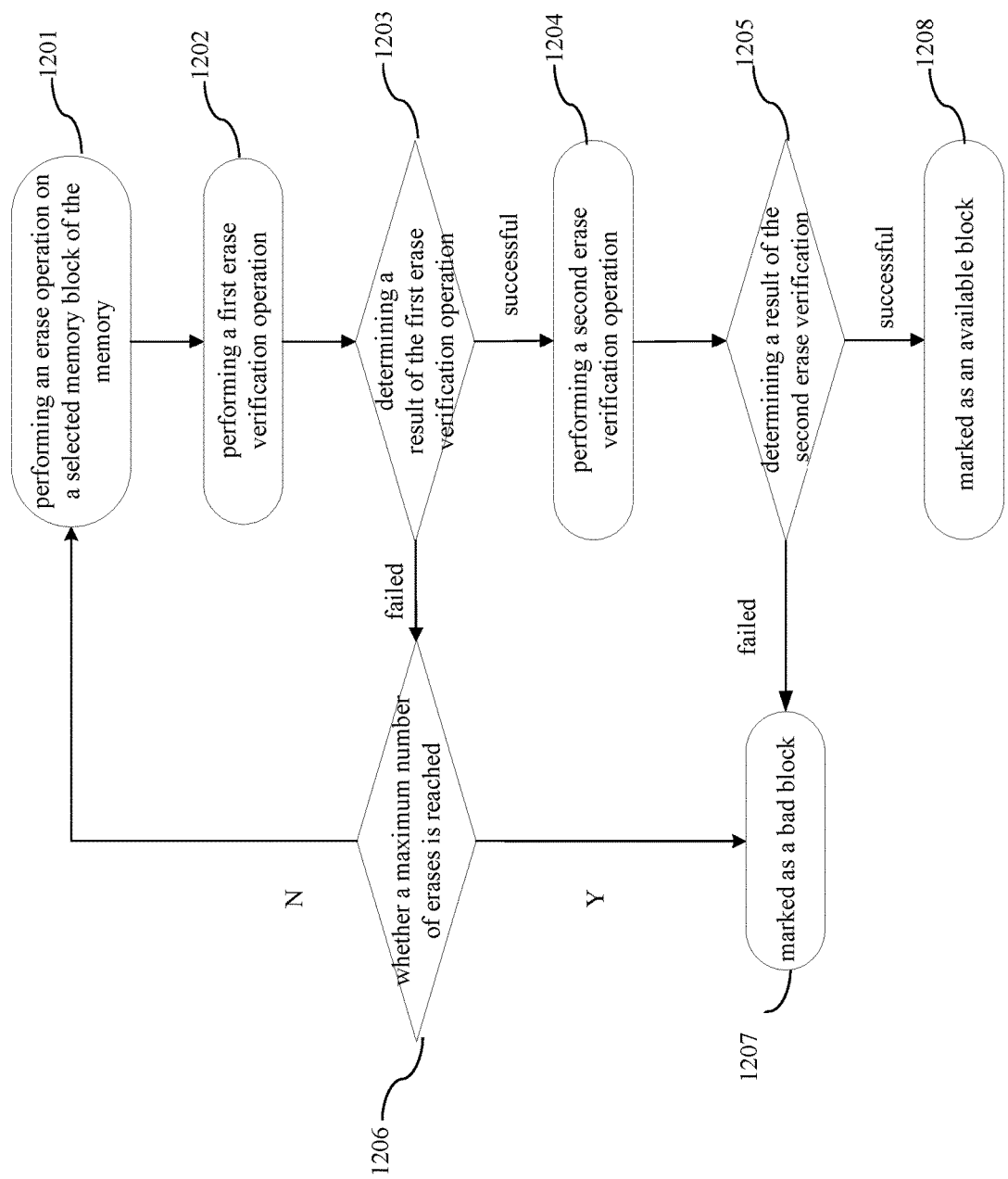
FIG. 12 is a flow diagram of an operation method of a memory system provided according to an implementation of the present disclosure.

In order to understand the operation method of the memory provided by the implementation of the present disclosure, FIG. 12 shows a schematic flowchart of the operation method of the memory provided by the implementation of the present disclosure.

In FIG. 12, on the memory side, the operation method may specifically include the following:

Step 1201: performing an erase operation on the selected memory block in the memory;

Step 1202: performing a first erase verification operation on the selected memory block in the memory after the erase operation is performed on the memory block;

Step 1203: determine the first verification result of the first erase verification operation; wherein, going to Step 1204 when the first verification result is configured to indicate that the memory block is successfully erased after the erase operation; going to Step 1206 when the first verification result is configured to indicate that the memory block has not been successfully erased after the erase operation;

Step 1204: performing a second erase verification operation on the memory block;

Step 1205: determining the second verification result of the second erase verification operation; wherein, going to Step 1208 when the verification result is configured to indicate that there is no inter-word line leakage in the memory block; going to Step 1207 when the verification result is configured to indicate that there is inter-word line leakage in the memory block;

Step 1206: if the first verification result as a feedback indicates that the memory block is not successfully erased after the erase operation, determining whether the erase operation currently performed has reached a maximum number of erases; if it is determined that the erase operation currently performed has not reached the maximum number of erases, going to Step 1201, until the maximum number of erases is reached; if it is determined that the erase operation currently performed has reached the maximum number of erases, going to Step 1207.

Step 1207: saving the first flag; the first flag is configured to indicate that the memory block is a bad block;

Step 1208: saving a second flag; the second flag is configured to indicate that the memory block is an available block.

It should be noted that here is a flowchart of the completion of the operation method on the memory side. The nouns and steps appearing here have been described in detail above and will not be repeated.

An implementation of the present disclosure also provides a memory, including: a memory array; the memory array includes a plurality of memory blocks; and a peripheral circuit coupled to the memory array; wherein, the peripheral circuit is configured to perform a first erase verification operation on a selected memory block in the memory after performing an erase operation on the memory block; determining a first verification result of the first erase verification operation; determining whether to perform a second erase verification operation on the memory block based on the first verification result; the first verification result is configured to reflect whether the memory block was successfully erased after the erase operation; the second erase verification operation is configured to determine whether there is inter-word line leakage in the memory block.

In some implementations, the peripheral circuit comprises: a control circuit, a voltage generator, a word line driver, and a sense amplifier; the voltage generator, the word line driver, and the sense amplifier are coupled to the plurality of memory blocks and controlled by the control circuit; the word line driver is configured to apply an erase verification voltage to the memory block through the voltage generator under the control of the control circuit; the sense amplifier is configured to sense a signal to be verified corresponding to the erase verification voltage; the control circuit is configured to determine a first verification result of the first erase verification operation based on the signal to be verified; determine whether to perform a second erase verification operation on the memory block based on the first verification result.

Here, the signal to be verified is a voltage signal or a current signal for causing the control circuit to determine a first verification result (or erase status) of the erase operation.

In some implementations, the control circuit is further configured to: determine to perform the second erase verification operation on the memory block when the first verification result indicates that the memory block has been successfully erased after the erase operation; determine not to perform the second erase verification operation on the memory block when the first verification result indicates that the memory block was not successfully erased after the erase operation.

In some implementations, the control circuit is further configured to: perform the second erase verification operation on the memory block when it is determined to perform the second erase verification operation on the memory block; determine a second verification result of the second erase verification operation; the second verification result is configured to reflect whether there is inter-word line leakage in the memory block.

In some implementations, the peripheral circuit further comprises: a first register configured to save a first flag when the first verification result indicates that the memory block was not successfully erased after the erase operation or when the verification result is configured to indicate that there is inter-word line leakage in the memory block; the first flag is configured to indicate that the memory block is a bad block.

In some implementations, the peripheral circuit further comprises: a second register configured to save a second flag when the second verification result is configured to indicate that there is no inter-word line leakage in the memory block; the second flag is configured to indicate that the memory block is an available block.

It should be noted that the first and the second registers are only used to describe registers in different situations, and the first register and the second register may be one in a practical application process, that is, the first and second registers described here are not used to limit the present disclosure.

In some implementation, the peripheral circuit further comprises: an inter-word line leakage detection circuit coupled to the memory block; the word line driver is further configured to apply a leakage detection voltage to a word line to be detected in the memory block through the voltage generator under the control of the control circuit; ground the word line adjacent to the word line to be detected; stop applying the leakage detection voltage to the word line to be detected when the leakage detection voltage of the word line to be detected reaches a predetermined value; the inter-word line leakage detection circuit is configured to detect the residual voltage of the word line to be detected after a preset time; compare the residual voltage with the reference voltage to obtain a comparison result; transmit the comparison result to the control circuit; the control circuit is further configured to receive the comparison result and feed the second verification result back to the control circuit based on the comparison result.

In some implementations, the control circuit is further configured to: determine that the second verification result is configured to indicate that there is no leakage between the word line to be detected and adjacent word lines in the memory block when the comparison result is that the absolute value of the difference between the residual voltage and the reference voltage is less than a preset threshold; determine that the second verification result is configured to indicate there is a leakage between the word line to be detected and an adjacent word lines in the memory block when the comparison result is that an absolute value of the difference between the residual voltage and the reference voltage is not less than the preset threshold.

In some implementations, the inter-word line leakage detection circuit comprises: a comparison module; wherein, the comparison module is configured to detect the residual voltage of the word line to be detected after a preset time; compare the residual voltage and the reference voltage to obtain a comparison result; and transmit the comparison result to the control circuit.

In some implementations, the inter-word line leakage detection circuit further comprises an isolation module that is configured to isolate the comparison module and the voltage generator.

In some implementations, the comparison module comprises a reference voltage source and a comparator, wherein, the reference voltage source is configured to provide the reference voltage and input the reference voltage to the comparator; the comparator is configured to detect the residual voltage of the word line to be detected after a preset time, and receive the reference voltage; compare the residual voltage with the reference voltage to obtain a comparison result; and transmit the comparison result to the control circuit.

In some implementations, the isolation module comprises an isolation capacitor configured to isolate the comparison module and the voltage generator.

It should be noted that for the description of the leakage detection circuit between word lines, see FIGS. 10(*a*) and 10(*b*) and the text description above.

In some implementations, the peripheral circuit is further configured to determine to perform a second erase verification operation on word lines of a predetermined range in the memory block when the first verification result is configured to indicate that the memory block was successfully erased after the erase operation.

In some implementations, the memory includes 3D NAND type memory.

It should be noted that the memory here belongs to the same inventive concept as the erase verification method described above, and the terms and operations used here have been described in detail above and will not be repeated.

Implementations of the present disclosure also provide a memory system, including one or more above-mentioned memories; and a memory controller coupled to the memory.

In some implementations, the peripheral circuit is configured to: receive a first instruction; in response to the first instruction, perform an erase operation on a selected memory block in the memory, and perform a first erase verification operation on the memory block; determine a first verification result of the first erase verification operation; determine whether to perform a second erase verification operation on the memory block based on the first verification result; the second erase verification operation being configured to determine whether there is inter-word line leakage in the memory block; save a first flag when the first verification result is configured to indicate that the memory block was not successfully erased after the erase operation or that there is inter-word leakage in the memory block; save a second flag when the first verification result is configured to indicate that the memory block was successfully erased after the erase operation and that there is no word line leakage in the memory block; the memory controller being configured to issue a second instruction according to the first flag; and issue a third instruction according to the second flag; the peripheral circuit being configured to receive the second instruction; perform no programming operation on the memory block anymore in response to the second instruction; receive the third instruction; and perform the programming operation on the memory block in response to the third instruction.

Here, the first instruction is transmitted from the memory controller 602 to the peripheral circuit 302 through the interface 616, so that the peripheral circuit performs an erase operation on the selected memory block in the memory in response to the first instruction, and perform a first erasure verification operation on the memory block; determine a first verification result of the first erasure verification operation; and determine whether to perform a second erasure verification operation on the memory block based on the first verification result. The second instruction is transmitted by the memory controller 602 to the peripheral circuit through the interface 616, so that the peripheral circuit performs no programming operation on the memory block anymore in response to the second instruction. The third instruction is transmitted by the memory controller 602 to the peripheral circuit 302 through the interface 616, so that the peripheral circuit performs a program operation on the memory block in response to the third instruction.

The memory system herein belongs to the same inventive concept as the erase verification method memory described above. Terms and operations which appear herein have been described in detail above and are not repeated.

It should be noted that the terms such as "first," "second," etc., are used to distinguish similar objects and need not be used to describe a specific order or sequence.

In addition, the technical solutions described in the implementations of the present disclosure can be arbitrarily combined without conflict. The above description is only some implementations of the present disclosure and is not intended to limit the scope of protection of the present disclosure.

What is claimed is:

1. A method of erase verification of a memory, comprising:
    performing a first erase verification operation on a memory block of the memory after performing an erase operation on the memory block;
    determining a first verification result of the first erase verification operation, the first verification result being configured to reflect whether the memory block was successfully erased after the erase operation; and
    determining whether to perform a second erase verification operation on the memory block based on the first verification result, the second erase verification operation being configured to determine whether there is inter-word line leakage in the memory block and comprising:
        applying a leakage detection voltage to a word line to be detected in the memory block to detect a residual voltage of the word line to be detected after a preset time;
        comparing the residual voltage and a reference voltage to obtain a comparison result; and
        determining a second verification result based on the comparison result, comprising:
            determining that the second verification result indicates that there is no leakage between the word line to be detected and an adjacent word line in the memory block when the comparison result shows that an absolute value of a difference between the residual voltage and the reference voltage is less than a preset threshold; and
            determining that the second verification result indicates that there is leakage between the word line to be detected and the adjacent word line in the memory block when the comparison result shows that the absolute value of the difference between the residual voltage and the reference voltage is equal to or greater than the preset threshold.

2. The method according to claim 1, wherein determining whether to perform the second erase verification operation on the memory block based on the first verification result comprises:
    determining to perform the second erase verification operation on the memory block when the first verification result indicates that the memory block was successfully erased after the erase operation; and
    determining not to perform the second erase verification operation on the memory block when the first verification result indicates that the memory block was not successfully erased after the erase operation.

3. The method according to claim 2, further comprising:
    performing the second erase verification operation on the memory block when it is determined to perform the second erase verification operation on the memory block; and
    determining the second verification result of the second erase verification operation, wherein the second verification result is configured to reflect whether there is inter-word line leakage in the memory block.

4. The method according to claim 3, further comprising:
    saving a first flag when the first verification result indicates that the memory block was not successfully erased after the erase operation or when the second verification result indicates that there is inter-word line leakage in the memory block, wherein the first flag is configured to indicate that the memory block is a bad block.

5. The method according to claim 4, further comprising:
    saving a second flag when the second verification result indicates that there is no inter-word line leakage in the memory block, wherein the second flag is configured to indicate that the memory block is an available block capable of subsequent programming operations.

6. The method according to claim 5, wherein the first flag or the second flag is stored in a register in the memory.

7. The method according to claim 2, further comprising:
    determining to perform the second erase verification operation on word lines of a predetermined range in the memory block when the first verification result indicates that the memory block was successfully erased after the erase operation.

8. The method according to claim 1, wherein the first erase verification operation comprises:
    applying an erase verification voltage to the memory block to sense a signal to be verified corresponding to the erase verification voltage; and
    determining the first verification result of the first erase verification operation based on the signal to be verified.

9. The method according to claim 8, wherein
    the memory comprises memory blocks;
    each of the memory blocks comprises memory cells and word lines coupled to the memory cells, respectively; and
    applying the erase verification voltage to the memory block comprises applying the erase verification voltage to the word lines in the memory block using a same voltage source or a different voltage source.

10. The method according to claim 1, wherein applying the leakage detection voltage to the word line to be detected in the memory block to detect the residual voltage of the word line to be detected after the preset time comprises:
applying the leakage detection voltage to the word line to be detected;
grounding a word line adjacent to the word line to be detected;
stopping applying the leakage detection voltage to the word line to be detected when the leakage detection voltage of the word line to be detected reaches a predetermined value; and
detecting the residual voltage of the word line to be detected after the preset time.

11. The method according to claim 1, wherein the second erase verification operation is performed by an inter-word line leakage detection circuit built in the memory.

12. The method according to claim 1, wherein the second erase verification operation comprises:
applying a leakage detection voltage to a word line to be detected in the memory block;
coupling a capacitor with the word line to be detected and charging the capacitor; and
in response to a potential change of the word line from the leakage detection voltage, allowing a potential of the capacitor coupled to the word line in a floating state to decrease to obtain the residual voltage of the word line to be detected.

13. The method according to claim 1, wherein:
when the first verification result indicates that the memory block was successfully erased after the erase operation and when the second verification result indicates that there is inter-word line leakage in the memory block, saving a first flag; and
when the first verification result indicates that the memory block was successfully erased after the erase operation and when the second verification result indicates that there is no inter-word line leakage in the memory block, saving a second flag, the second flag being different from the first flag.

14. The method according to claim 1, wherein
when the first verification result indicates that the memory block was not successfully erased after the erase operation and a number of performing the erase operation is less than a number threshold, performing the erase operation again and accumulating the number of performing the erase operation; and
when the number of performing the erase operation is equal to the number threshold, save a first flag to indicate the memory block as a bad block.

15. A memory, comprises:
a memory array comprising memory blocks; and
a peripheral circuit coupled to the memory array and configured to:
perform a first erase verification operation on a memory block of the memory after performing an erase operation on the memory block;
determine a first verification result of the first erase verification operation; and
determining whether to perform a second erase verification operation on the memory block based on the first verification result,
wherein:
the first verification result is configured to reflect whether the memory block was successfully erased after the erase operation;
the second erase verification operation is configured to determine whether there is inter-word line leakage in the memory block;
the peripheral circuit is further configured to:
determine to perform the second erase verification operation on the memory block when the first verification result indicates that the memory block was successfully erased after the erase operation, comprising determining to perform the second erase verification operation on word lines of a predetermined range in the memory block when the first verification result indicates that the memory block was successfully erased after the erase operation, wherein start and end addresses are retrieved from registers coupled to the peripheral circuit to obtain the predetermined range of the word lines in the memory block; and
determine not to perform the second erase verification operation on the memory block when the first verification result indicates that the memory block was not successfully erased after the erase operation.

16. The memory according to claim 15, wherein
the peripheral circuit comprises a control circuit, a voltage generator, a word line driver, and a sense amplifier;
the voltage generator, the word line driver, and the sense amplifier are coupled to the memory blocks and are controlled by the control circuit;
the word line driver is configured to apply an erase verification voltage to the memory block through the voltage generator under control of the control circuit;
the sense amplifier is configured to sense a signal to be verified corresponding to the erase verification voltage; and
the control circuit is configured to:
determine the first verification result of the first erase verification operation based on the signal to be verified; and
determine whether to perform the second erase verification operation on the memory block based on the first verification result.

17. The memory according to claim 16, wherein the control circuit is further configured to:
perform the second erase verification operation on the memory block when it is determined to perform the second erase verification operation on the memory block; and
determine a second verification result of the second erase verification operation, the second verification result being configured to reflect whether there is inter-word line leakage in the memory block.

18. The memory according to claim 17, wherein the peripheral circuit further comprises:
a first register configured to save a first flag when the first verification result indicates that the memory block was not successfully erased after the erase operation or when the second verification result indicates that there is inter-word line leakage in the memory block, the first flag being configured to indicate that the memory block is a bad block.

19. The memory according to claim 17, wherein the peripheral circuit further comprises:
a second register configured to save a second flag when the second verification result indicates that there is no inter-word line leakage in the memory block, the second flag being configured to indicate that the memory block is an available block capable of subsequent programming operations.

20. A memory system, comprising:

a memory comprising a memory array comprising memory blocks; and a peripheral circuit coupled to the memory array and configured to:

perform a first erase verification operation on a selected memory block of the memory after performing an erase operation on the memory block;

determine a first verification result of the first erase verification operation; and determine whether to perform a second erase verification operation on the memory block based on the first verification result, wherein:

the first verification result is configured to reflect whether the memory block was successfully erased after the erase operation; and the second erase verification operation is configured to determine whether there is inter-word line leakage in the memory block, the second erase verification operation comprising:

applying a leakage detection voltage to a word line to be detected in the memory block to detect a residual voltage of a word line to be detected after a preset time;

comparing the residual voltage and a reference voltage to obtain a difference between the residual voltage and the reference voltage; and determining a second verification result based on a comparison between the difference and a preset threshold; and a memory controller coupled to the memory.

* * * * *